(12) United States Patent
Kuroda

(10) Patent No.: US 8,872,609 B2
(45) Date of Patent: Oct. 28, 2014

(54) INDUCTOR ELEMENT AND INTEGRATED CIRCUIT DEVICE

(75) Inventor: Tadahiro Kuroda, Kanagawa (JP)

(73) Assignee: Keio University, Tokyo (JP)

( * ) Notice: Subject to any disclaimer, the term of this patent is extended or adjusted under 35 U.S.C. 154(b) by 0 days.

(21) Appl. No.: 13/203,403

(22) PCT Filed: Feb. 19, 2010

(86) PCT No.: PCT/JP2010/052520
§ 371 (c)(1),
(2), (4) Date: Aug. 25, 2011

(87) PCT Pub. No.: WO2010/098258
PCT Pub. Date: Feb. 9, 2010

(65) Prior Publication Data
US 2011/0309907 A1    Dec. 22, 2011

(30) Foreign Application Priority Data

Feb. 25, 2009   (JP) .................................. 2009-042134

(51) Int. Cl.
    *H01F 27/32* (2006.01)
(52) U.S. Cl.
    USPC ........................................................ 336/84 C
(58) Field of Classification Search
    USPC ......... 336/65, 84 R, 84 C, 200, 232; 257/531
    See application file for complete search history.

(56) References Cited

U.S. PATENT DOCUMENTS

| 2002/0011606 A1 | 1/2002 | Otake et al. |
| 2005/0247999 A1 | 11/2005 | Nishikawa et al. |
| 2006/0202789 A1 * | 9/2006 | Hyvonen ...................... 336/200 |
| 2006/0284718 A1 | 12/2006 | Baumgartner et al. |
| 2007/0158849 A1 | 7/2007 | Higashi et al. |

FOREIGN PATENT DOCUMENTS

| JP | 61-144052 A | 7/1986 |
| JP | 7-86523 A | 3/1995 |
| JP | 2002-009244 A | 1/2002 |
| JP | 2003-78017 A | 3/2003 |
| JP | 2005-228981 A | 8/2005 |
| JP | 2005-252272 A | 9/2005 |
| JP | 2005252272 A * | 9/2005 |

(Continued)

OTHER PUBLICATIONS

N. Miura et al., "Analysis and Design of Transceiver Circuit and Inductor Layout for Inductive Inter-chip Wireless Superconnect," Symposium on VLSI Circuits, Dig. Tech. Papers, Jun. 2004, pp. 246-249.

(Continued)

*Primary Examiner* — Tuyen Nguyen
(74) *Attorney, Agent, or Firm* — Westerman, Hattori, Daniels & Adrian, LLP

(57) ABSTRACT

The invention relates to an inductor element and an integrated circuit device where the efficiency of use of wire materials is high and noise interference through capacitive/inductive coupling from peripheral wires is low.

Coil elements 1, 2 are provided in at least two adjacent layer levels having main wires which run in different directions so that each coil element 1 (2) is connected to a coil element 2 (1) in a different layer level so as to form one coil, and shield wires 3, 4 are connected to a power 5 either above or below or to the left or right of said coil elements 1, 2.

6 Claims, 26 Drawing Sheets

(56) References Cited

FOREIGN PATENT DOCUMENTS

| JP | 2005-348264 A | 12/2005 |
|---|---|---|
| JP | 2006-050354 A | 2/2006 |
| JP | 2006-066454 A | 3/2006 |
| JP | 2006-105630 A | 4/2006 |
| JP | 2006-173415 A | 6/2006 |
| JP | 2006-173986 A | 6/2006 |
| JP | 2007-005798 A | 1/2007 |
| JP | 2007-208248 A | 8/2007 |
| WO | 2004/107444 A1 | 12/2004 |

OTHER PUBLICATIONS

N. Miura et al., "Cross Talk Countermeasures in Inductive Inter-chip Wireless Superconnect," in Peoc. IEEE Custom Integrated Circuits Conference, Oct. 2004, pp. 99-102.

N. Miura et al., "A 195 Gb/s 1.2 W 3D-Stacked Inductive Inter-Chip Wireless Superconnect with Transmit Power Control Scheme," IEEE International Solid-State Circuits Conference, Dig. Tech. Papers, Feb. 2005, pp. 264-265.

N. Miura et al., "A 1Tb/s 3W Inductive-Coupling Transceiver for Inter-Chip Clock and Data Link," IEEE International Solid-State Circuits Conference, Dig. Tech. Papers, Feb. 2006, pp. 424-425.

N. Miura et al., "A 0.14pJ/b Inductive-Coupling Inter-Chip Data Transceiver with Digitally-Controlled Precise Pulse Shaping," IEEE International Solid-State Circuits Conference, Dig. Tech. Papers, Feb. 2007, pp. 264-265.

D. Mizoguchi et al., "A1.2 Gb/s/pin Wireless Superconnect Based on Inductive Inter-Chip Signaling (IIS)," IEEE International Solid-State Circuits Conference, Dig. Tech. Papers, Feb. 2004, pp. 142-143, 517.

K. Niitsu et al., "Interference from Power/Signal Lines and to SRAM Circuits in 65nm CMOS Inductive-Coupling Link," IEEE Asian Solid-State Circuits Conference, Dig. Tech. Papers, Nov. 2007, pp. 131-134.

N. Miura et al., "An 11Gb/s Inductive-Coupling Link with Burst Transmission," IEEE International Solid-State Circuits Conference, Dig. Tech. Papers, Feb. 2008, pp. 298-299.

I. Hiroki et al., "An Attachable Wireless Chip Access Interface for Arbitrary Data Rate Using Pulse-Based Inductive-Coupling through LSI Package," IEEE International Solid-State Circuits Conference, Dig. Tech. Papers, 2007, pp. 360-361.

International Search Report of PCT/JP2010/052520, mailing date Mar. 23, 2010.

* cited by examiner (a)

(b)

(a)

(b)

(a)

(b)

(a)

(b)

(a)

(b)

(a)

(b)

(a)

(b)

INDUCTOR ELEMENT AND INTEGRATED CIRCUIT DEVICE

TECHNICAL FIELD

The present invention relates to an inductor element and an integrated circuit device, and in particular to an inductor element for magnetic communication between substrates, such as of IC bare chips and printed circuit boards, and an integrated circuit device which is characterized by the structure for reducing noise caused by capacitive coupling between the inductor element and the peripheral wires.

BACKGROUND ART

In recent years, mounting semiconductor integrated circuit devices on a substrate with high density has been required since portable electronic devices have been miniaturized, and in response to this, layering a number of semiconductor chips three-dimensionally has been attempted.

In such a three-dimensionally mounted semiconductor integrated circuit device, the semiconductor chips are generally connected through microbumps in order to exchange signals between the semiconductor chips. In the case where three or more semiconductor chips are layered on top of each other, however, it is necessary to create through vias that penetrate through the semiconductor chip(s) in the middle. In order to create such through vias that penetrate through semiconductor chip(s), a complex manufacturing process is necessary, and at the same time high precision with the process is required.

Electrical connection between semiconductor chips through capacitive coupling has also been proposed as another method. In accordance with this method, though no problem arises in the case where there are only two semiconductor chips, the efficiency in transmitting signals dramatically lowers in the case where there are three or more semiconductor chips. In order to compensate for this, it is necessary to increase the output, and therefore such a problem arises that the power consumption increases.

Communication between semiconductor chips through antennas mounted on the chips has been proposed as still another method. In accordance with this method as well, however, such a problem arises that the transmission efficiency lowers when there are three or more semiconductor chips.

Thus, the present inventors have proposed communication using a magnetic field due to inductive coupling between the LSI (integrated circuit device) chips layered on top of each other and mounted on a substrate via coils formed of wires on the chips (see, for example, Patent Documents 1 to 7 and Non-Patent Documents 1 to 8).

For example, the present inventors have proposed a formation of rectangular patterns for a coil in layers using a metal wire such that two pairs of patterns almost overlap when projected in the middle and lower layers as well as in the upper and lower layers so that the upper and lower rectangular patterns are alternately connected through vias to form one coil (see, for example, Non-Patent Document 2).

In addition, the present inventors have examined cross talking in magnetic field communication using the above described coil in terms of a signal inputted not only to the reception side coil that faces the transmission side coil, but also to a reception side coil adjacent to this reception side coil. As a result of this examination, the inventors had found that the distance between adjacent coils could be set to a predetermined value so that the value gained by integrating the magnetic flux density within the reception coil could be made 0, that is to say cross talking could be prevented (see, for example, Patent Document 4).

Furthermore, the present inventors have examined the effects of the peripheral wires on the efficiency in transmitting signals in the case where the peripheral wires are provided between a pair of coils facing each other as described above (see, for example, Non-Patent Document 8). As a result of this examination, it had been confirmed that the peripheral wires that run in one direction, such as conventional bus lines, had almost no effect on the transmission efficiency.

PRIOR ART DOCUMENTS

Patent Documents

Patent Document 1: Japanese Unexamined Patent Publication 2005-228981
Patent Document 2: Japanese Unexamined Patent Publication 2005-348264
Patent Document 3: Japanese Unexamined Patent Publication 2006-050354
Patent Document 4: Japanese Unexamined Patent Publication 2006-066454
Patent Document 5: Japanese Unexamined Patent Publication 2006-105630
Patent Document 6: Japanese Unexamined Patent Publication 2006-173986
Patent Document 7: Japanese Unexamined Patent Publication 2006-173415

Non-Patent Documents

Non-Patent Document 1: D. Mizoguchi et al., "A1. 2 Gb/s/pin Wireless Superconnect based on Inductive Inter-chip Signaling (IIS)," IEEE International Solid-State Circuits Conference (ISSCC '04), Dig. Tech. Papers, pp. 142-143, 517, February 2004
Non-Patent Document 2: N. Miura et al., "Analysis and Design of Transceiver Circuit and Inductor Layout for Inductive Inter-chip Wireless Superconnect," Symposium on VLSI Circuits, Dig. Tech. Papers, pp. 246-249, June 2004
Non-Patent Document 3: N. Miura et al., "Cross Talk Countermeasures in Inductive Inter-Chip Wireless Superconnect," in Peoc. IEEE Custom Integrated Circuits Conference (CICC '04), pp. 99-102, October 2004
Non-Patent Document 4: N. Miura, D. Mizoguchi, M. Inoue, H. Tsuji, T. Sakurai and T. Kuroda, "A 195 Gb/s 1.2 W 3D-Stacked Inductive Inter-Chip Wireless Superconnect with Transmit Power Control Scheme," IEEE International Solid-State Circuits Conference (ISSCC '05), Dig. Tech. Papers, pp. 264-265, February 2005
Non-Patent Document 5: N. Miura, D. Mizoguchi, M. Inoue, K. Niitsu, Y. Nakagawa, M. Tago, M. Fukaishi, T. Sakurai and T. Kuroda, "A 1 Tb/s 3W Inductive-Coupling Transceiver for Inter-Chip Clock and Data Link," IEEE International Solid-State Circuits Conference (ISSCC '06), Dig. Tech. Papers, pp. 424-425, February 2006
Non-Patent Document 6: N. Miura, H. Ishikuro, T. Sakurai and T. Kuroda, "A 0.14 pJ/b Inductive-Coupling Inter-Chip Data Transceiver with Digitally-Controlled Precise Pulse Shaping," IEEE International Solid-State Circuits Conference (ISSCC '07), Dig. Tech. Papers, pp. 264-265, February 2007
Non-Patent Document 7: N. Miura, Y Kohama, Y. Sugimori, H. Ishikuro, T. Sakurai and T. Kuroda, "An 11 Gb/s Inductive-Coupling Link with Burst Transmission," IEEE International Solid-State Circuits Conference (ISSCC '08), Dig. Tech. Papers, pp. 298-299, February 2008

Non-Patent Document 8: K. Niitsu, Y. Sugimori, Y. Kohama, K. Osada, N. Irei, H. Ishikuro and T. Kuroda, "Interference from Power/Signal Lines to Sram Circuits in 65 nm CMOS Inductive-Coupling Link," IEEE Asian Solid-State Circuits Conference, Dig. Tech. Papers, pp. 131-134, November 2007

SUMMARY OF THE INVENTION

Problem to be Solved by the Invention

The above described coils having conventional structures have a spiral pattern winding in the same plane, and another metal wire in the same layer cannot cross the coil. Accordingly, when there is a region at the center of the coil where no wires are used (open portion), this region cannot be used, and there is such a problem that wires must go around the coil.

Thus, the present inventors have proposed the formation of one coil through connections of coil elements to coil elements provided in adjacent layer level(s) where the coil elements in at least the two layer levels have main wires which run in different directions (see Japanese Patent Application 2008-126934).

FIGS. 23($a$) and 23($b$) are diagrams illustrating the structure of an inductor element proposed by the present inventors. FIG. 23($a$) is a schematic perspective diagram and FIG. 23($b$) is a projected schematic plan diagram. As shown in the figures, metal wires in the first layer form linear first coil elements $10$, metal wires in the second layer form second coil elements $30$ which run in the direction perpendicular to the first coil elements $10$, and the first coil elements $10$ and the second coil elements $30$ are alternately connected through connection vias $20$ so as to form one coil which winds clockwise.

In this case, the coil elements are formed in the direction in which the main wires, such as bus lines, are wired in each layer. Here, the coil elements $10$ and $30$ are formed in a line and space pattern having, for example, the 1 μm rule, and the coil elements $10$ and $30$ in the outermost periphery have a length of, for example, 100 μm. Here, in FIG. 23($b$), the second coil elements $30$ are represented by solid lines and the first coil elements $10$ are represented by dotted lines.

When the coil wire is traced starting from point A, a line is drawn out from point A so as to form the second coil element $30_1$, the other end of this second coil element $30_1$ is connected to the first coil element $10_1$ through the connection via $20_1$, and the other end of this first coil element $10_1$ is connected to the second coil element $30_2$ through the connection via $20_2$.

Next, the other end of this second coil element $30_2$ is connected to the first coil element $10_2$ through the connection via $20_3$, and the other end of this first coil element $10_2$ is connected to the second coil element $30_3$ through the connection via $20_4$.

Then, the other end of this second coil element $30_3$ is connected to the first coil element $10_3$ through the connection via $20_5$, and the other end of this first coil element $10_3$ is connected to the second coil element $30_4$ through the connection via $20_6$.

Next, the other end of this second coil element $30_4$ is connected to the first coil element $10_4$ through the connection via $20_7$, and the other end of this first coil element $10_4$ is connected to the second coil element $30_5$ through the connection via $20_8$.

Then, the other end of this second coil element $30_5$ is connected to the first coil element $10_5$ through the connection via $20_9$, and the other end of this first coil element $10_5$ is connected to the second coil element $30_6$ through the connection via $20_{10}$.

Next, the other end of this second coil element $30_6$ is connected to the first coil element $10_6$ through the connection via $20_{11}$, and finally the other end of this first coil element $10_6$ is drawn out to the point B through the connection via $20_{12}$.

FIG. 24 is a projected schematic plan diagram showing an inductor element together with peripheral wires where the peripheral wires are shown as fine lines in order to make it easy to distinguish the peripheral wires from the coil elements that form the inductor element. Here, the peripheral wires $35$ formed of metal wires in the second layer are represented by solid lines, and the peripheral wires $15$ formed of metal wires in the first layer are represented by dotted lines. As shown in the figure, the peripheral wires $15$ and $35$ are respectively formed so as to pass through the open portion at the center of the coil, and the wires are provided so as to cross the coil while using the wire material in the open portion of the coil.

By adopting such a structure, the efficiency of using the wire material can be increased. In addition, use of this coil makes it possible to provide appropriate communication between chips, such as IC (integrated circuit) bare chips, which are layered on top of each other and mounted on a substrate.

When peripheral wires are provided in a layer beneath or above the above described first coil elements ($10_1$ to $10_6$) or second coil elements ($30_1$ to $30_6$), however, a new problem arises such that capacitive coupling is caused between the coil elements and the peripheral wires. Here, inductive coupling is caused in the same manner, but only a case of capacitive coupling is described below.

In addition, in the case where peripheral wires are provided adjacent and parallel to the first coil elements or the second coil elements in the same layer, capacitive coupling is caused between the above described coil elements and the peripheral wires, and thus noise interference is caused in the same manner.

Furthermore, at intersections between coil elements and peripheral wires which cross perpendicular to the coil elements as well, capacitive coupling is caused between the coil elements and the peripheral wires, and thus causes noise interference in the same manner. For example, peripheral wires that are perpendicular to the first coil elements $10$ using wires $M_4$, which are metal wires in the fourth layer, from among wires $M_3$, which are metal wires in the third layer, and wires $M_5$, which are metal wires in the fifth layer, cause noise interference to the first coil elements $10$ due to capacitive coupling. In addition, peripheral wires that are perpendicular to the second coil elements $30$ using wires $M_5$ from among wires $M_4$ and wires $M_6$ cause noise interference to the second coil elements $30$ due to capacitive coupling.

As a result, in wireless communication, such as inductive coupling communication using coils as antennas, signals from peripheral wires overlap reception coils through capacitive coupling, and thus deteriorate the quality of communication. Alternatively, signals from a transmission coil overlap peripheral wires through capacitive coupling, and thus there is a possibility of the signals interfering with the peripheral circuit. In the case where the peripheral circuit is a circuit having low resistance to noise, such as analog circuits and memory circuits, this noise interference may cause a problem.

In the case of inductive coupling communication using a near-field, the dimensions of the coil are determined by the communication distance. In many cases, for example, the radius of the coil is designed to be approximately equal to the communication distance. Accordingly, when the communication distance is long, the dimensions of the coil are large. The greater the dimensions of the coil are, the larger the area is through which the coil elements face the above described peripheral wires provided beneath, above, to the left or to the right of the coil elements parallel to the coil elements or the peripheral wires beneath or above the coil elements which cross the coil elements, and thus the capacitive coupling is stronger.

When the above described capacitive coupling is great to such an extent that it cannot be ignored in comparison with the sum of the grounding capacitance of the coil itself and the input capacitance of the reception circuit to which the coil is connected, the noise is too large to be ignored compared to the received signal, and thus the bit error rate increases in the data communication.

For example, a quadrilateral coil having a 260 µm side, being formed of wires $M_4$ that have a wire width of 1.5 µm and run in the longitudinal direction and wires $M_5$ that run in the lateral direction, and being wound three times with wire intervals of 1.5 µm is assumed. A peripheral wire made of $M_2$ having a wire width of 0.25 µM and a wire length of 1 mm or a peripheral wire made of a wire $M_6$ directly above a wire $M_4$ is provided directly beneath this coil, and a case where a signal having a voltage amplitude of 1.8 V and a rising/falling time of 150 ps passes through the peripheral wire is simulated and examined so as to find that the differential noise caused between the two terminals of the coil is 100 mV or more, as described below.

Alternatively, as shown in FIGS. 25(a) and 25(b), a coil having the same dimensions as described above and peripheral wires that cross the coil were simulated using the same signal as described above. The average differential noise caused in each side of the coil per peripheral wire was 15 µV (in the case where the peripheral wire crosses the upper side in the figure) to 100 µV (in the case where the peripheral wire crosses the lower side in the figure) as shown in FIGS. 25(a) and 25(b).

That is to say, the peak value of the differential noise between the terminals A and B caused by the noise received from one peripheral wire that crosses the upper side is 15 µV on average in the case of one wound coil (N=1). In the same manner, the peak value of the differential noise between the terminals A and B caused by the noise received from one peripheral wire that crosses the lower side, the left side and the right side are 100 µV, 50 µV and 50 µV, respectively. The peak value of the differential noise received from the four peripheral wires in the case where the peripheral wires cross the four sides equally is 215 µV, which is the sum of the above peak values.

In the case where 200 peripheral wires cross the lower side on the left side of the two terminals, 200 peripheral wires cross the lower side on the right side as well, signals with a pulse from high to low simultaneously pass through the 200 peripheral wires on the left side, and signals with a pulse from low to high simultaneously pass through the 200 peripheral wires on the right side, differential noise of 40 mV is generated between the two ends of the coil. In the case where the width of the peripheral wires is 0.25 µm and the intervals are 0.25 µm, 200 peripheral wires can cross the coil element having a length of 100 µm.

Noise generated in a coil due to capacitive coupling includes in-phase noise (noise $V_A$ observed at the terminal A and noise $V_B$ observed at the terminal B) and differential noise ($V_A$-$V_B$). Noise overlapping the coil element through capacitive coupling propagates to the two terminals A and B of the coil. In the case where the distance between the portion of the capacitive coupling and the terminal A of the coil and the distance between the portion of the capacitive coupling and the terminal B are different, noise propagates with different delay times so as to attenuate with different waveforms. As a result, $V_A$ and $V_B$ provide different waveforms, thus causing differential noise.

The cause of the differential noise is described in detail in reference to FIGS. 25(a) and 25(b). As shown in FIG. 25(a), one round of the coil is 1040 µm. The parasitic capacitance of the coil is 0.1 pF and the parasitic resistance is 100Ω. Midpoint C of the coil wire is connected to a bias circuit with an impedance of 1 kΩ. Here, a case where a peripheral wire crosses the lower side at the center of the left half is assumed.

At this location, noise $V_0$ of 500 µV/100 ps (=5 µV/ps) overlaps from one peripheral wire through capacitive coupling. The distance to the terminal A is 65 µM and the distance to the terminal B is 975 µm. The noise $V_0$ that has overlapped through capacitive coupling reaches the terminal A as a noise waveform of approximately 4.95 µV/ps at about the time 0 ps. After that, it reaches the terminal B as a noise waveform of approximately 4.25 µV/ps at about the time 8.8 ps.

As a result, as shown in FIG. 25(b), differential noise is caused across the two terminals of the coil. That is to say, the following noise is caused at time 8.8 ps:

$$4.95\ [\mu V/ps] \times 8.8\ [ps] = 44\ [\mu V]$$

After that, the following noise overlaps between time 8.8 ps and time 100 ps so that the noise becomes 108 µV at time 100 ps:

$$(4.95\ [\mu V/ps] - 4.25\ [\mu V/ps]) \times (100\ [ps] - 8.8\ [ps]) = 64\ [\mu V]$$

After that, the noise attenuates, and therefore the peak voltage ends up with approximately 100 µV per peripheral wire.

Thus, the waveform of the differential noise ($V_A$-$V_B$) is determined by the product of the difference [ps] in the delay of noise propagation and the difference [µV/ps] in the inclination of the noise waveforms due to the attenuation of the noise waveforms, and these two differences occur due to the difference in the distance between the location at which the noise overlaps and the two terminals of the coil.

In addition, in the case where the number of windings of the coil is two (N=2) as shown in FIG. 26(a), the peak values of the differential noise between the terminals A and B caused by noise from one peripheral wire that crosses the upper side, the lower side, the left side and the right side are 30 µV, 180 µV, 90 µV and 90 µV, respectively. The peak value of the differential noise from the four peripheral wires in the case where the peripheral wires cross the four sides equally is 390 µV, which is the sum of the above described peak values.

Furthermore, in the case where the number of windings of the coil is three (N=3) as shown in FIG. 26(b), the peak values of the differential noise between the terminals A and B caused by noise from one peripheral wire that crosses the upper side, the lower side, the left side and the right side are 50 µV, 250 µV, 110 µV and 110 µV, respectively. The peak value of the differential noise from the four peripheral wires in the case where the peripheral wires cross the four sides equally is 520 µV, which is the sum of the above described peak values.

The two ends of the coil are connected to a differential comparator in a receiver so that the difference in the voltage between the two ends is read out, and therefore in-phase noise is removed and differential noise causes a problem. The differential signal generated across the two terminals of a coil when a signal is received for communication is approximately 200 mV. The sensitivity and the hysteresis properties are set so that the signal is received and the noise does not cause a malfunction. In the case where differential noise of approximately 40 mV is generated in the coil, the probability of a malfunction is high.

Accordingly, an object of the present invention is to increase the efficiency of use of the wire material by allowing peripheral wires to cross the coil elements so as to pass through the open portion of the coil, and at the same time to reduce noise interference due to capacitive/inductive coupling with peripheral wires.

Means for Solving Problem

FIG. 1 is a diagram showing the structure for illustrating the principle of the present invention, and the means for solving the problem according to the present invention is described below in reference to FIG. 1.

(1) In order to achieve the above described object, the present invention provides an inductor element provided with: coil elements 1, 2 in at least two adjacent layer levels having main wires which run in different directions so that each coil element 1 (2) is connected to a coil element 2 (1) in a different layer level so as to form one coil; and shield wires 3, 4 connected to the power 5 either above or below or to the left or right of the above described coil elements 1, 2.

Here, in the present specification, the layer level means a layer where there are wires in the same level.

As described above, shield wires 3, 4 are provided in order to shield the coil elements 1, 2, and thus inductive coupling communication with high reliability becomes possible without being affected by a signal flowing through a peripheral wire provided in the vicinity of the coil elements 1, 2. In this case, the shield wires 3, 4 may be provided only above or below the coil elements 1 (2) or may be provided only to the left or right of the coil elements 1 (2). Alternatively, they may be provided above, below, and to the left and right of the coil elements 1 (2).

(2) In addition, according to the present invention, shield wires 3, 4 may not form a closed loop in the above (1). In the case where a closed loop is formed, the inductance of the coil lowers when an eddy current flows, which deteriorates the received signal in the inductive coupling communication.

(3) Furthermore, the present invention provides an inductor element provided with: coil elements 1, 2 in at least two adjacent layer levels having main wires which run in different directions so that each coil element 1 (2) is connected to a coil element 2 (1) in a different layer level so as to form one coil; and either a layered wire prohibiting region where a wire is prohibited from being layered on the coil elements 1, 2 adjacent to as well as above or below the above described coil elements 1, 2 or an in-plane wire prohibiting region where wiring is prohibited in the same plane with the above described coil elements 1, 2 where the region can include one to three peripheral wires to the right or left of the above described coil wires.

Thus, there are no peripheral wires in close vicinity to the coil elements 1, 2 when a wire prohibiting region where a wire is prohibited from being layered on the coil elements 1, 2 at least either above or below or to the left or right of the coil elements 1, 2 is provided. Accordingly, the inductor element is barely affected by a signal flowing through a peripheral wire so that inductive coupling communication with high accuracy becomes possible. In this case as well, the wire prohibiting region may be provided only above or below the coil elements 1 (2), may be provided to the left or right of the coil elements 1 (2), or may be provided above, below, to the left and right of the coil elements 1 (2).

(4) In addition, the present invention provides an inductor element provided with: coil elements 1, 2 in at least two adjacent layer levels having main wires which run in different directions so that each coil element 1 (2) is connected to a coil element 2 (1) in a different layer level so as to form one coil; and extended coil elements which extend from two terminals A, B of the above described coil.

Thus, the main part of the noise which overlaps the coil elements 1, 2 is offset by the noise which overlaps the extended coil elements 1, 2 when the extended coil elements are provided to the two terminals A, B of the coil. As a result, less noise is generated in the inductor element, and therefore inductive coupling communication with high accuracy becomes possible.

(5) Furthermore, the present invention provides an inductor element provided with coil elements 1, 2 in at least two adjacent layer levels having main wires which run in different directions so that each coil element 1 (2) is connected to a coil element 2 (1) in a different layer level so as to form one coil, wherein the potential at the center of the above described coil is fixed.

Thus, the noise, which overlaps the coil elements 1, 2 is absorbed by the center portion of the coil when the potential at the center of the coil is fixed. Meanwhile, the signal for inductive coupling communication is not affected, and therefore the signal-to-noise ratio in the inductive coupling communication is increased.

(6) In addition, the present invention provides an inductor element provided with: coil elements 1, 2 in at least two adjacent layer levels having main wires which run in different directions so that each coil element 1 (2) is connected to a coil element 2 (1) in a different layer level so as to form a number of coils having similar figures, which are placed around the center of the openings of the above described coils so as to have point symmetry, and at the same time the above described number of coils are arranged in such a manner that each coil in the next layer is rotated in the same direction around the center of the above described openings and connected in series in the vicinity of the center of the above described openings.

Thus, a number of coils having similar figures are arranged so as to have point symmetry and be connected to each other, and therefore the distance between the point at which noise caused by a peripheral wire overlaps and the two terminals of the coil is equal, and as a result differential noise can be greatly reduced.

(7) Furthermore, the present invention provides an integrated circuit device wherein the inductor element according to any of the above (1) to (6) is provided to a semiconductor chip, and at the same time a wire that runs through the opening at the center of the above described inductor element is provided.

When an inductor element having the above described structure is provided to a semiconductor chip, no noise due to a wire that runs through the opening at the center of the inductor element is generated in the inductor element even when the wire is provided.

Effects of the Invention

The disclosed inductor element and integrated circuit device make it possible for a peripheral wire to run through a coil having large dimensions, and as a result the density of the integration of the integrated circuit can be increased while maintaining the quality of communication of inductive coupling communication over a long distance. This inductor element can be used as an antenna for wireless communication, such as inductive coupling communication, and in addition can be used as an inductor in various circuits, such as oscillator circuits and amplifier circuits.

BEST MODE FOR CARRYING OUT THE INVENTION

The embodiments of the present invention are described below. According to the present invention, coil elements are provided in at least two adjacent layer levels having main wires, which run in different directions so that each coil element is connected to a coil element in a different layer level so as to form a coil, and various types of noise measures are provided to the thus-formed coil.

Concrete measures are:

a. Installation of shield wires: shield wires connected to the power are provided in the vicinity of the coil elements above, below, to the left and right of the coil elements so that capacitive/inductive coupling is blocked between the coil elements and the peripheral wires provided parallel to the coil elements. In this case, it is better for the shield wires not to form a closed loop.

b. Prohibition of a peripheral wire from running adjacent and parallel to the coil elements: a peripheral wire is prohibited from being provided so as to run adjacent and parallel to the coil elements above, below, to the left or right of the coil elements. In the case of automatic wiring, a wire prohibiting region is provided.

c. Addition of extended coil elements to the two terminals: coil elements are extended from the two terminals of the coil so that noise that overlaps the extended coil elements can offset the main part of the noise that overlaps the coil elements.

d. Fixture of potential at the center of the coil: noise that overlaps the coil elements is absorbed by the center portion of the coil. Meanwhile, the signals are not affected. Accordingly, the signal-to-noise ratio is increased.

e. Rotational arrangements and connections of a number of coils so as to have point symmetry: a number of coils having similar figures are arranged around the center of the openings of the coils so as to have point symmetry, and each coil is connected to the next coil in the same direction of rotation around the center so that all the coils are connected in series. The wires for the series connection run in the vicinity of the center so that the distance between the point at which noise overlaps and the two terminals of the coil is equal. The above described noise measures a to e are used individually or a number of these are combined when an inductor element is formed.

In addition, an inductor, to which such a noise measure has been provided, is provided to a semiconductor chip, and thus an integrated circuit device can be implemented such that the quality of communication of inductive coupling communication is maintained over a long distance even when a wire that runs through the opening of the inductor element at the center is provided.

First Embodiment

Figure 1:
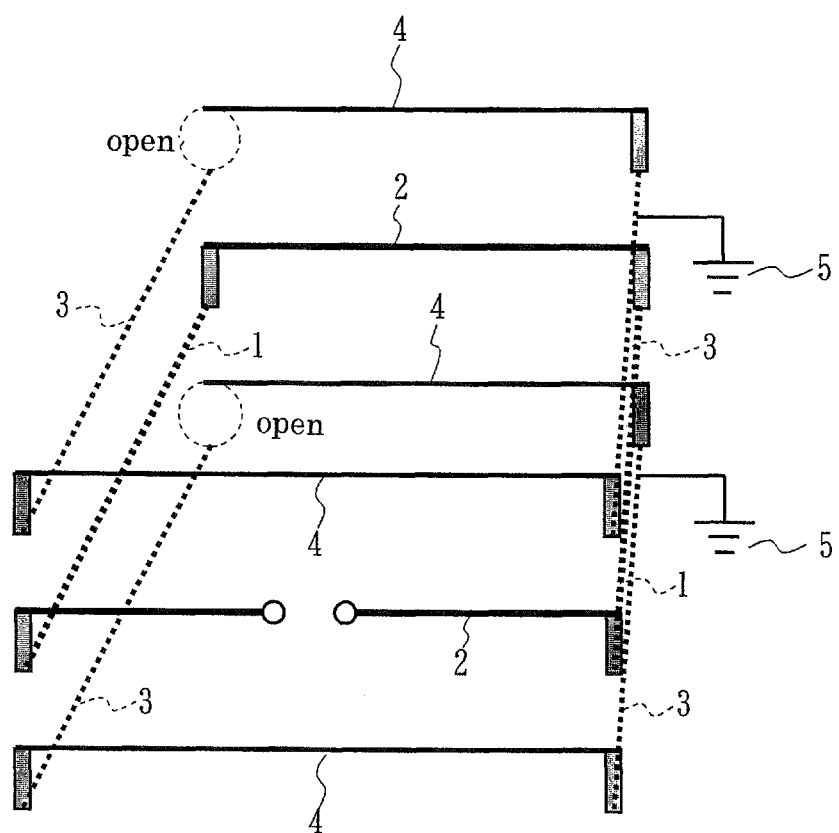
FIG. 1 is a diagram showing the structure for illustrating the principle of the present invention.
Figure 2:
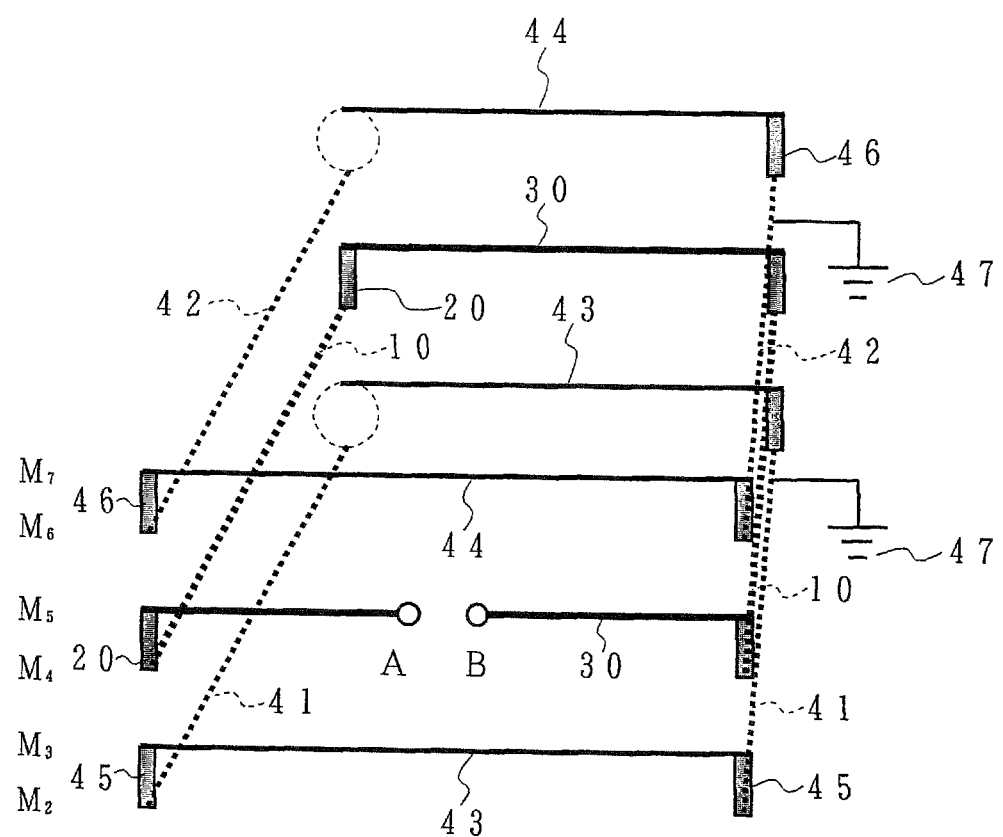
FIG. 2 is a schematic perspective diagram showing the inductor element according to the first embodiment of the present invention.

Next, on the basis of the above description, the inductor element according to the first embodiment of the present invention is described in reference to FIG. 2. FIG. 2 is a schematic perspective diagram showing the inductor element according to the first embodiment of the present invention, in which a case of a one-wound coil made of wires $M_4$ and $M_5$ is illustrated in order to simplify the description. Here, the first coil element 10 and the second coil element 30 are connected through a connection via 20 so as to form the one-wound coil. $M_4$ and $M_5$ represent layer levels such that $M_4$ means a metal wire layer in the fourth layer.

First, the wires $M_2$ and $M_6$ in the metal wire layers directly above and below the first coil element 10 made of the wire $M_4$ form shield wire elements 41, 42 provided parallel to the first coil element 10 made of the wire $M_4$. Meanwhile, the wires $M_3$ and $M_7$ in the metal wire layers directly above and below the second coil element 30 made of the wire $M_5$ form shield wire elements 43, 44 provided parallel to the second coil element 30 made of the wire $M_5$, and the shield wire element 41 and the shield wire element 43 are connected through a connection via 45. In addition, the shield wire element 42 and the shield wire element 44 are connected through a connection via 46.

Here, each shield wire has one end open so that the shield wire does not form a closed loop, and the power is connected to the shield wire. The power may be $V_{DD}$, GND or other types of power, and even may be the output of a bias circuit. In the case where a shield wire makes a closed loop so that an eddy current flows, the inductance of the coil lowers and the received signal through inductive coupling communication is deteriorated, which is not desirable.

As a result, capacitive coupling between the peripheral wire formed of the wire $M_2$ or the peripheral wire formed of the wire $M_6$ and the first coil element 10 formed of the wire $M_4$ is blocked. Likewise, capacitive coupling between the peripheral wire formed of the wire $M_3$ or the peripheral wire formed of the wire $M_7$ and the second coil element 30 formed of the wire $M_5$ is blocked.

In this case, the width of the shield wire elements 41 to 44 is 1.5 µm when they are equal to the width of the first coil element 10 and the second coil element 30. The width of and the distance between the peripheral wires are 0.25 µm, and therefore one shield wire prohibits three peripheral wires from running through. In the case of a coil with sides of 260 µm, however, more than 500 peripheral wires can run through the opening of the coil, and therefore even when shield wires prevent six peripheral wires from running through the two sides of the coil, the effects are small and no problem arises.

Second Embodiment

Figure 3:
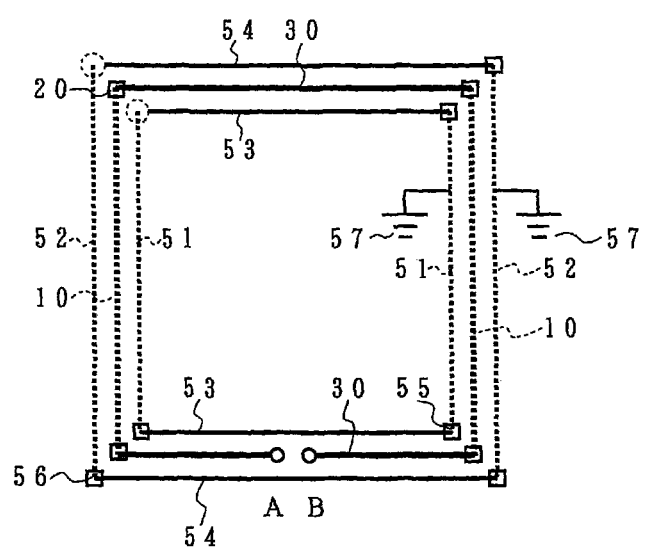
FIG. 3 is a schematic plan diagram showing the inductor element according to the second embodiment of the present invention.

Next, the inductor element according to the second embodiment of the present invention is described in reference to FIG. 3. FIG. 3 is a schematic plan diagram showing the inductor element according to the second embodiment of the present invention in which a case of a one-wound coil made of the wire $M_4$ and $M_5$ is illustrated in order to simplify the description. Here, the first coil element 10 and the second coil element 30 are connected through a connection via 20 so as to form the one-wound coil.

In the second embodiment of the present invention, shield wire elements 51, 52 are formed of the wire $M_4$ to the left and right of and very close to the first coil element 10 made of the wire $M_4$. Meanwhile, shield wire elements 53, 54 are formed of the wire $M_5$ to the left and right of and very close to the second coil element 30 made of the wire $M_5$. The shield wire element 51 and the shield wire element 53 are connected through a connection via 25, and at the same time the shield wire element 52 and the shield wire element 54 are connected through a connection via 56. Here, the distance between the first coil element 10 and the shield elements 51 and 52 as well as the distance between the second coil element 30 and the shield elements 53 and 54 are such that a peripheral wire cannot run through.

In the second embodiment as well, the power is connected to each shield wire. The power may be $V_{DD}$ or GND and may even be the output of a bias circuit. As a result, capacitive coupling between the peripheral wire made of the wire $M_4$ or the peripheral wire made of the wire $M_5$ and the first coil element 10 formed of the wire $M_4$ or the second coil element 30 formed of the wire $M_5$ is blocked. In this case as well, each shield wire has an open loop.

In addition, the first embodiment and the second embodiment may be combined for use, and as a result capacitive coupling between the first coil element 10 formed of the wire $M_4$ or the second coil element 30 formed of the wire $M_5$ and the wires above, below, and to the left and right thereof can be blocked without fail.

Third Embodiment

Figure 4:
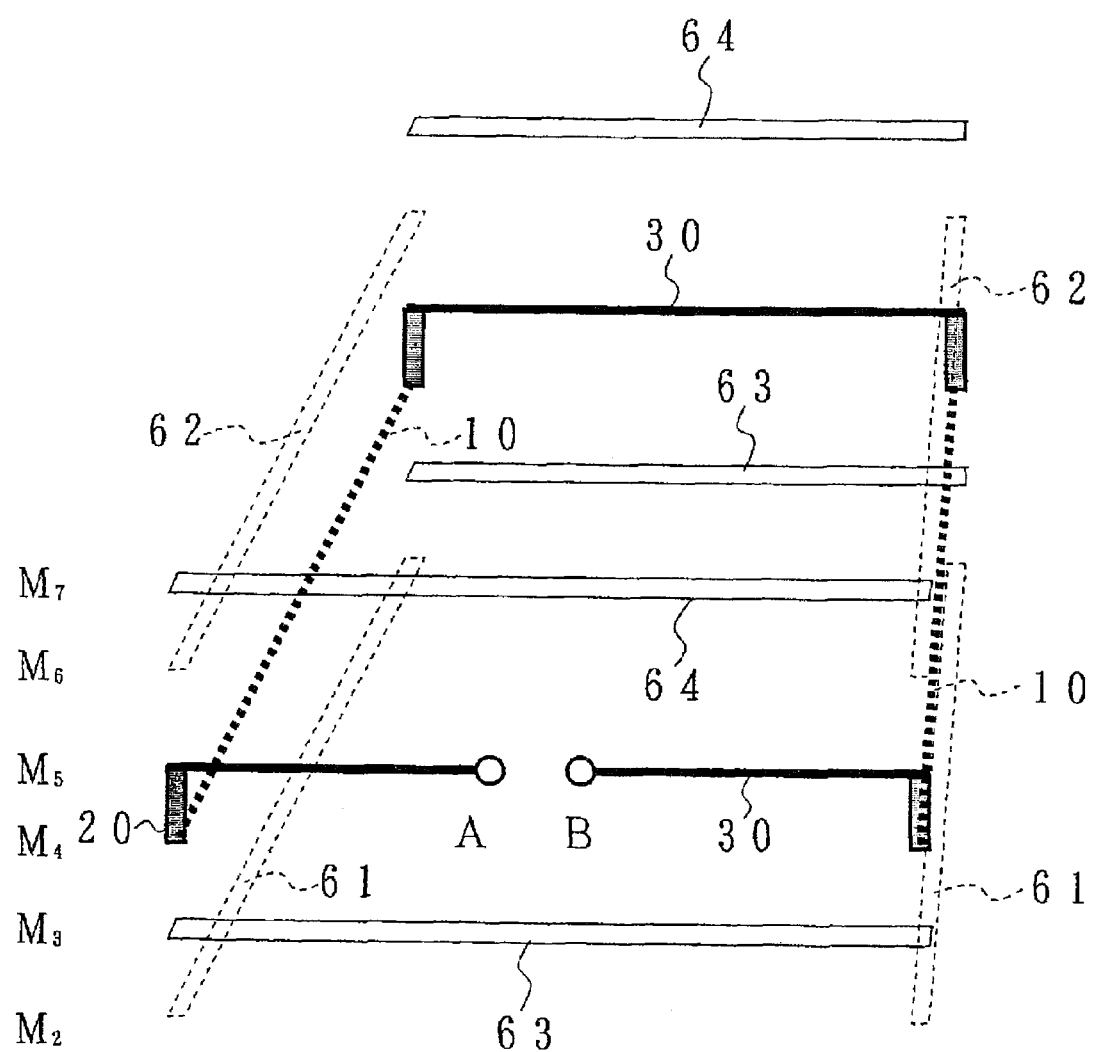
FIG. 4 is a schematic perspective diagram showing the inductor element according to the third embodiment of the present invention.

Next, the inductor element according to the third embodiment of the present invention is described in reference to FIG. 4. FIG. 4 is a schematic perspective diagram showing the inductor element according to the third embodiment of the present invention, in which a case of a one-wound coil made of the wire $M_4$ and the wire $M_5$ is illustrated in order to simplify the description. Here, the first coil element 10 and the second coil element 30 are connected through a connection via 20 so as to form the one-wound coil.

In the third embodiment, wire prohibiting regions 61, 62 are provided such that the wire $M_2$ and the wire $M_6$ in the metal wire layers directly above and below the first coil element 10 made of the wire $M_4$ prohibit a peripheral wire from being provided, and at the same time wire prohibiting regions 63, 64 are provided such that the wire $M_3$ and the wire $M_7$ in the metal wire layers directly above and below the second coil element 30 made of the wire $M_5$ prohibit a peripheral wire from being provided. In this case, the width of the wire prohibiting regions 61 to 64 covers the area next to the first coil element 10 and the second coil element 30 through which one to three peripheral wires can run.

Fourth Embodiment

Figure 5:
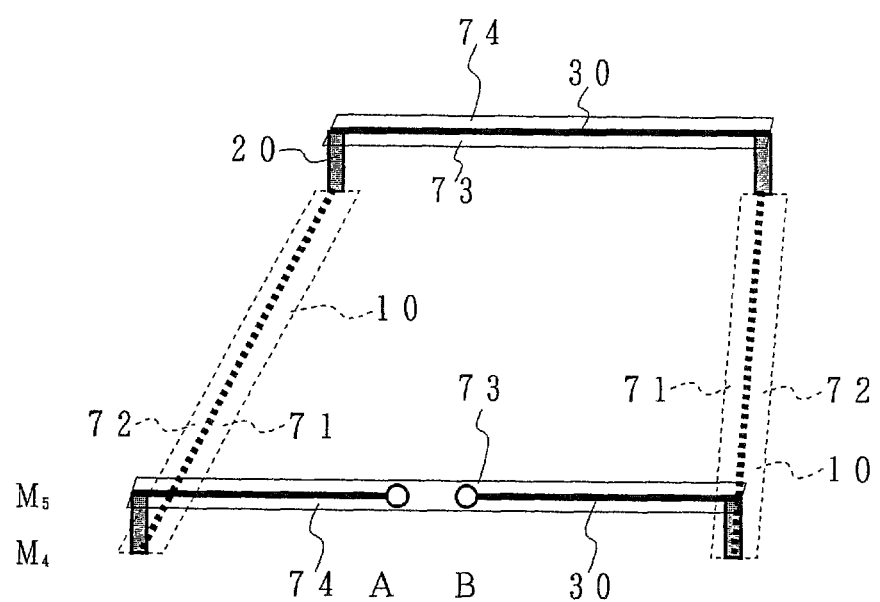
FIG. 5 is a schematic perspective diagram showing the inductor element according to the fourth embodiment of the present invention.

Next, the inductor element according to the fourth embodiment of the present invention is described in reference to FIG. 5. FIG. 5 is a schematic perspective diagram showing the inductor element according to the fourth embodiment of the present invention, and a case of a one-wound coil made of the wire $M_4$ and the wire $M_5$ is illustrated in order to simplify the description. Here, the first coil element 10 and the second coil element 30 are connected through a connection via 20 so as to form the one-wound coil.

In the fourth embodiment, wire prohibiting regions 71, 72 where the wire $M_4$ prohibits a peripheral wire from being provided to the left and right of and close to the first coil element 10 made of the wire $M_4$ are provided, and at the same time wire prohibiting regions 73, 74 where the wire $M_5$ prohibits a peripheral wire from being provided to the left and right of and close to the second coil element 30 made of the wire $M_5$ are provided. In this case, the wire prohibiting regions 71 to 74 covers the area next to an end of the coil elements through which one to three peripheral wires can run.

Figure 6:
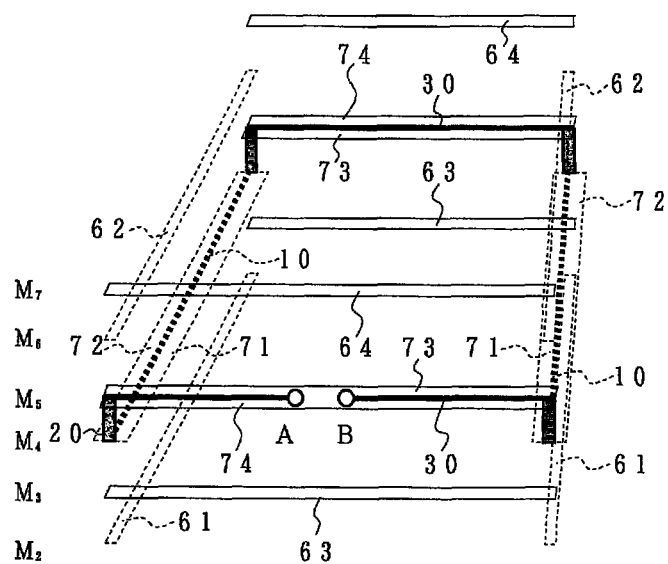
FIG. 6 is a schematic perspective diagram showing an inductor element having both structures in the third and fourth embodiments of the present invention.

In addition, as shown in FIG. 6, the third embodiment and the fourth embodiment may be combined for use, and as a result capacitive coupling between the first coil element 10 formed of the wire $M_4$ and wires below, above and to the left and right of the first coil element 10 as well as between the second coil element 30 formed of the wire $M_5$ and wires below, above and to the left and right of the second coil element 30 can be effectively blocked.

Furthermore, the first embodiment and the fourth embodiment or the second embodiment and the third embodiment can be combined for use so that capacitive coupling between the first coil element 10 formed of the wire $M_4$ and wires below, above and to the left and right of the first coil element 10 as well as between the second coil element 30 formed of the wire $M_5$ and wires below, above and to the left and right of the second coil element 30 can be effectively blocked.

Fifth Embodiment

Figure 7:
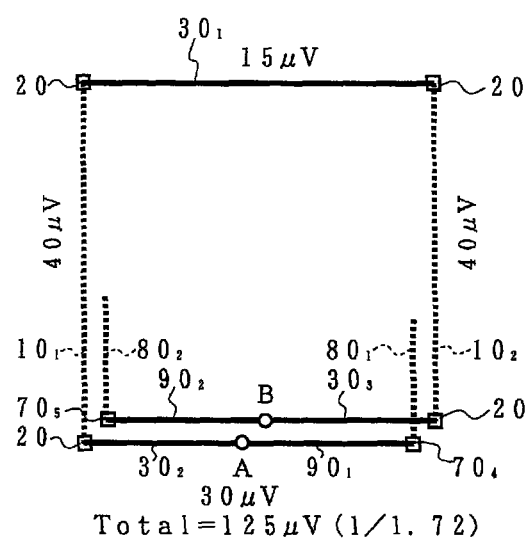
FIG. 7 is a schematic plan diagram showing the inductor element according to the fifth embodiment of the present invention.

Next, the inductor element according to the fifth embodiment of the present invention is described in reference to FIG. 7. FIG. 7 is a schematic plan diagram showing the inductor element according to the fifth embodiment of the present invention, and a case of a one-wound coil made of the wire $M_4$ and the wire $M_5$ is illustrated in order to simplify the description. Here, the first coil element 10 and the second coil element 30 are connected through a connection via 20 so as to form the one-wound coil.

In the fifth embodiment, extending coil elements $80_1$, $80_2$, $90_1$, $90_2$ made of the wire $M_4$ and the wire $M_5$ are provided to both ends A, B of the second coil elements $30_2$, $30_3$ made of the wire $M_5$. Here, the extending coil element $80_1$ and the extending coil element $90_1$ are connected through a connection via $70_4$, and the extending coil element $80_2$ and the extending coil element $90_2$ are connected through a connection via $70_5$. Here, these extending coil elements provided at the both ends have a length of approximately ¼ of the circumference of the coil.

Figure 8:
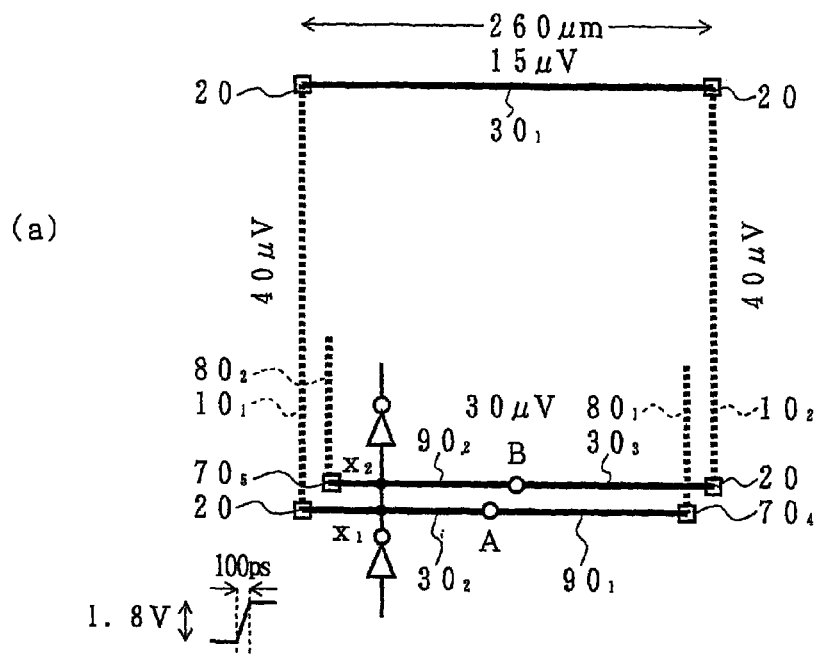
FIGS. 8(a) and 8(b) are diagrams for illustrating the mechanism according to which differential noise is generated in the fifth embodiment of the present invention.
Figure 8:
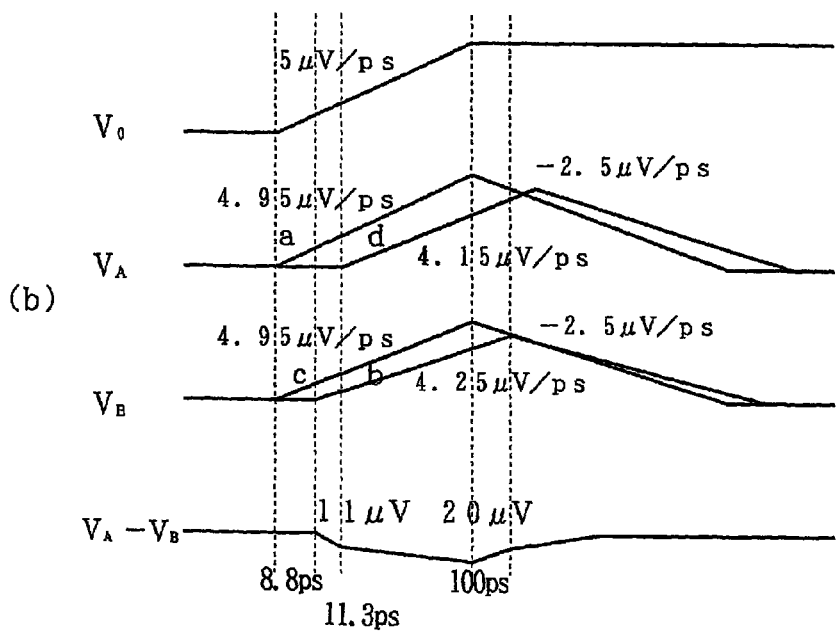

Next, the mechanism according to which differential noise is generated in the fifth embodiment is described in reference to FIGS. 8(a) and 8(b). As shown in FIG. 8(a), a case is assumed such that noise $V_0$ of 500 µV/100 ps (=5 µV/ps) from one peripheral wire overlaps the second coil element $30_2$ and the extending coil element $90_2$ in two locations $x_1$ and $x_2$ through capacitive coupling at the center of the left side of the terminal A along the lower side of the coil. The distance between $x_1$ and the terminal A is 65 µm, and the distance between $x_1$ and the terminal B is 975 µm. The distance between $x_2$ and the terminal A is 1105 µM, and the distance between $x_2$ and the terminal B is 65 µm.

The noise $V_0$ that overlaps $x_1$ and $x_2$ through capacitive coupling reaches the terminal A and the terminal B at approximately a time of 0 ps as noise waveforms a, c of 4.95 µV/ps. These two noises completely offset each other.

In addition, the noise that overlaps $x_1$ delays and reaches the terminal B at a time 8.8 ps as a noise waveform b of 4.25 µV/ps. Meanwhile, the noise that overlaps $x_2$ reaches the terminal A at a time of 11.3 ps as the noise waveform d of 4.15 µV/ps. As a result, as shown in FIG. 8(b), differential noise $(V_A-V_B)$ is generated per peripheral wire at the two terminals of the coil.

That is to say, the following differential noise is generated at a time of 11.3 ps:

4.25 µV/ps×(11.3 ps−8.8 ps)=11 µV

The following differential noise overlaps the above differential noise between a time of 11.3 ps and a time of 100 ps:

(4.25 µV/ps−4.15 µV/ps)×(100 ps−11.3 ps)=9 µV

Thus, the differential noise becomes 20 µV at a time of 100 ps. After that, the differential noise decreases and the peak voltage of the differential noise ends up with approximately 20 µV per peripheral wire.

The peak voltage of noise per peripheral wire is reduced from approximately 100 µV to 20 µV as compared to a conventional one-wound coil. The reason for this is that the coil element extending from the terminal B makes the distance between $x_1$ and the terminal A and the distance between $x_2$ and the terminal B equal so that the noise waveform a that reaches the terminal A initially is offset by the noise waveform c having the same waveform which reaches the terminal B at the same time. Noise waveform d is generated as a byproduct. As a result, the distance between $x_1$ and the terminal B is 975 µm and the distance between $x_2$ and the terminal A is 1105 µm, and this asymmetry makes the time and the amplitude different between the noise waveform b and the noise waveform d, which generates differential noise.

This differential noise, however, is smaller than the differential noise generated by the difference between the distance to the terminal A, which is 65 µm, and the distance to the terminal B, which is 975 µm, in the conventional one-wound coil. Here, the extending coil elements extending outside the two terminals are effective as long as their length does not exceed the one as shown in FIG. 7. If the length exceeds this, however, the differential noise increases conversely, for which the reason is described in reference to FIGS. 9(a) and 9(b).

Figure 9:
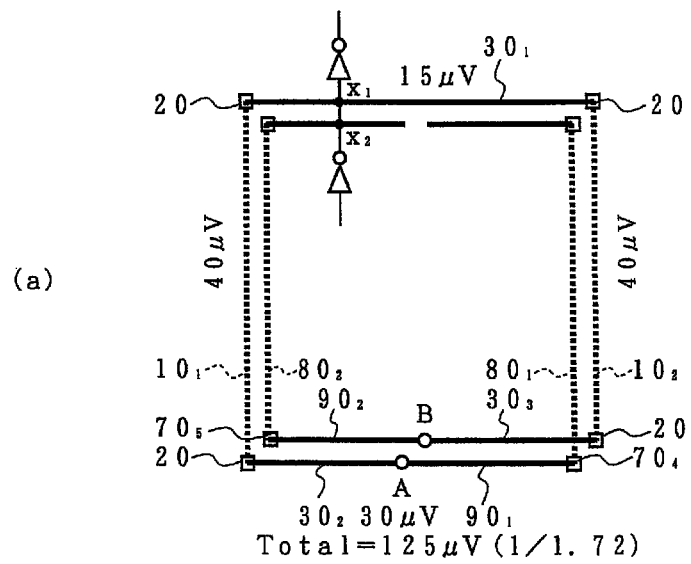
FIGS. 9(a) and 9(b) are diagrams for illustrating a comparative example.
Figure 9:
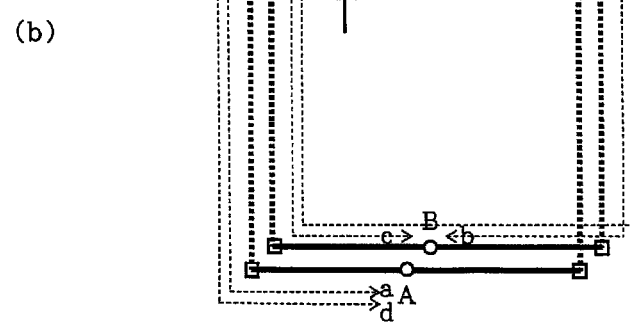

Cases are assumed, as shown in FIGS. 9(a) and 9(b), such that a peripheral wire crosses the upper side when the coil elements are extended by approximately ½ of the circumference of the coil outside the two terminals. As shown in FIG. 9(a), a case is assumed such that noise $V_0$ of 500 µV/100 ps (=5 µV/ps) from the peripheral wire overlaps the second coil element $30_1$ and the extending coil element $90_1$ at two locations $x_1$ and $x_2$ through capacitive coupling. As shown in FIG. 9(b), the distance between $x_1$ and the terminal A is 455 µm, and the distance between $x_1$ and the terminal B is 585 µm. Meanwhile, the distance between $x_2$ and the terminal A is 1495 µm, and the distance between $x_2$ and the terminal B is 455 µm. Accordingly, the difference in the distance that causes the difference in the waveforms between the noise waveform b and the noise waveform d is 585 µm and 1495 µm, which are greater than 978 µm and 1105 µm in the case of FIG. 7. As a result, noise is greater than in the previous example.

When the length between the two terminals of the coil is D and a peripheral wire crosses the coil at a location where the wire length from the terminal A is N, the distance between $x_1$ and the terminal A is L, and the distance between $x_1$ and the terminal B is D−L. The distance between $x_2$ and the terminal A is D+L, and the distance between $x_2$ and the terminal B is L. When the time constant of the coil is 0.1 pF×100Ω=10 ps, the inclination of the overlapping noise is 500 µV/100 ps (=5 µV/ps), and 500 µV/120 ps=4.2 µV/ps for the distance D, the delay time for noise propagation and the inclination of the waveform can both be approximated in the following formulas as functions which are proportional to the squared distance:

$$\text{delay} = 10 \text{ [ps]} \times (L/D)^2 = 10k^2 \text{ [ps]}$$

$$\text{inclination} = 5[5 \ \mu V/\text{ps}] - 0.8 \ [5 \ \mu V/\text{ps}] \times (L/D)^2$$
$$= 5[5 \ \mu V/\text{ps}] - 0.8[5 \ \mu V/\text{ps}] \times k^2$$

Here, $k=L/D$.

The peak value $V_{p5}$ of the differential noise in the fifth embodiment shown in FIG. 7 is:

$$V_{p5} = (5 - 0.8k^2) \times 10\{(1+k)^2 - (1-k)^2\} + [\{5 - 0.8(1-k)^2\} -$$
$$\{5 - 0.8(1+k)^2\} \times \{(100 - 108(1-k)^2)\}]$$
$$= 520k - 64k^2$$

Meanwhile, the peak value $V_{p0}$ of the differential noise in a conventional one-wound coil is:

$$V_{p0} = (5 - 0.8k^2) \times 10\{(1-k)^2 - k^2\} +$$
$$[\{5 - 0.8k^2\} - \{5 - 0.8(1-k)^2\}] \times \{(100 - 108(1-k)^2)\}]$$
$$= 122 \cdot 228k - 48k^2 + 32k^3$$

Figure 25:
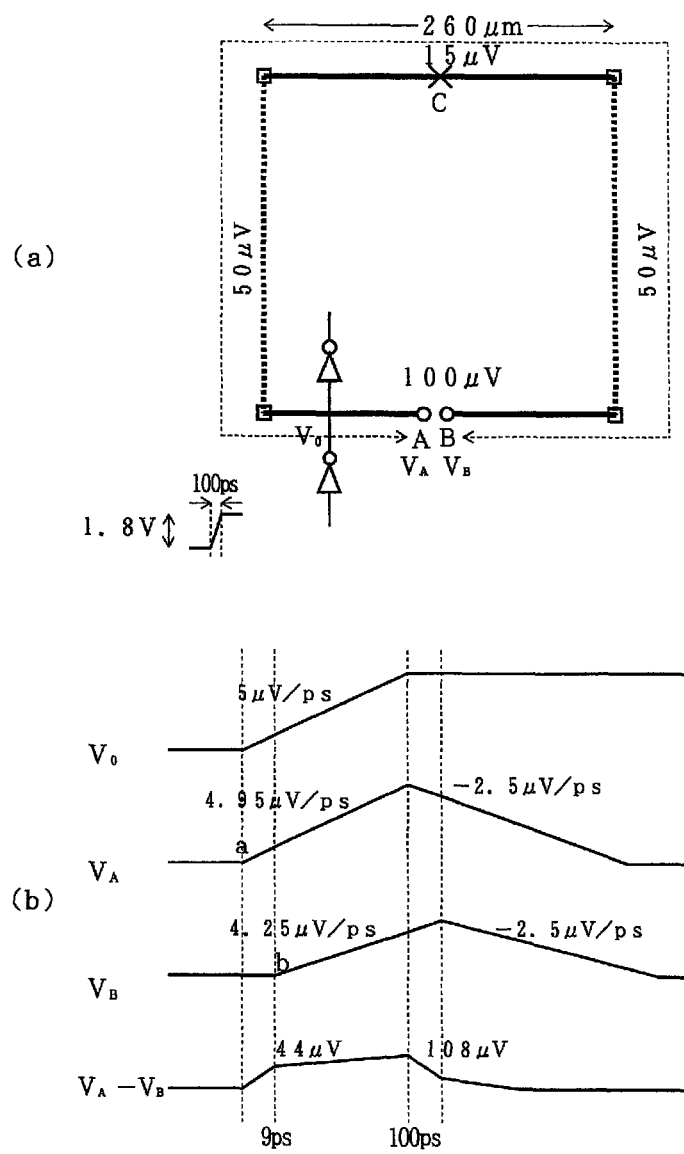
FIGS. 25(a) and 25(b) are diagrams for illustrating the mechanism according to which differential noise is generated.

In the case of $L=65$ μm as in FIGS. 25(a) and 25(b) and FIG. 7, for example, $k=\tfrac{1}{16}$. In the example of FIGS. 25(a) and 25(b), the peak value is: $V_{p0}=108$ μV. In the case of FIG. 7, the peak value is: $V_{p5}=32$ μV. These are approximately consistent with the above description. In the case where a wire crosses the coil at the center of the coil, $k=\tfrac{1}{2}$, and the peak value in the example in FIGS. 25(a) and 25(b) is: $V_{p0}=0$ μV, which is also consistent with the information.

The two formulas lead to $k<0.25$ in the case where noise is smaller in the fifth embodiment than in the prior art. That is to say, it can be seen that it is good to extend the coil elements by approximately ¼ of the entirety of the coil (or approximately ¼ of the circumference of the coil). Here, this value ¼ is affected by the preset wire parameters, and therefore for the time being, is a rough estimate.

In the case of a one-wound coil as shown in FIGS. 8(a) and 8(b), the peak value of the differential noise from the four peripheral wires when the peripheral wires cross the four sides in the same manner is 125 μV, which is approximately 1/1.72 times smaller than 215 μV which is the peak value of the differential noise in the case of FIGS. 25(a) and 25(b). In addition, the peak value of the differential noise generated from the peripheral wire that crosses the lower side is 30 μV which is approximately 1/3.3 times smaller than 100 μV, which is the peak value of the differential noise in the case of FIGS. 25(a) and 25(b). Accordingly, the peak value from the peripheral wires that cross the two sides, the upper and lower sides, is 45 μV (30 μV+15 μV), which is 1/2.6 times smaller than 115 μV (100 μV+15 μV) in the prior art.

Sixth Embodiment

Figure 10:
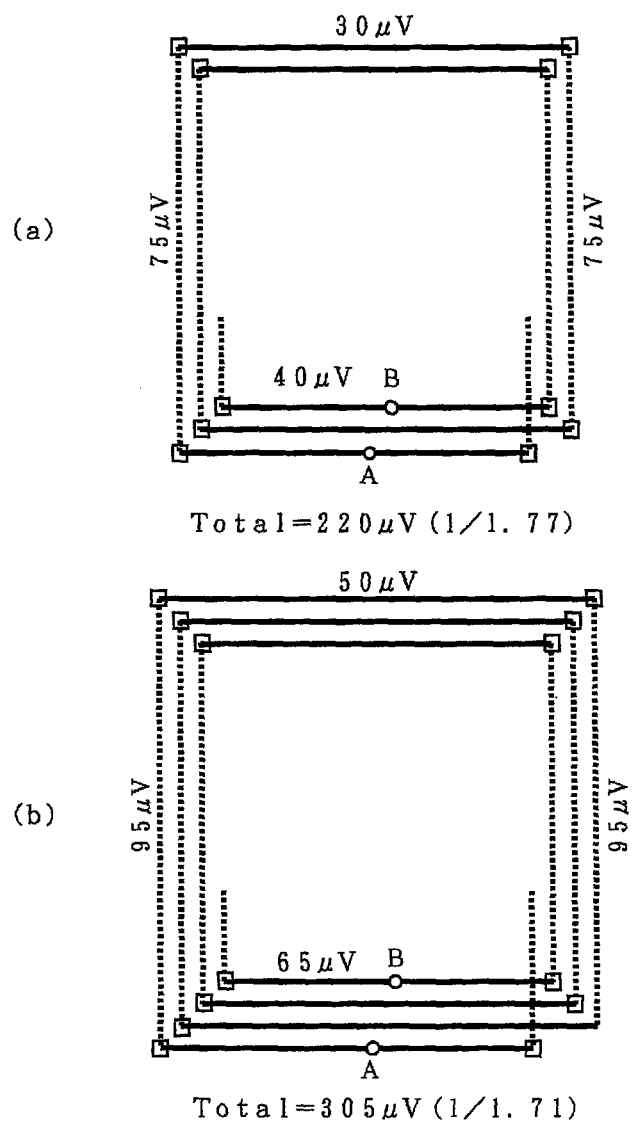
FIGS. 10(a) and 10(b) are diagrams for illustrating the structure of the inductor element according to the sixth embodiment of the present invention.

Next, the inductor element according to the sixth embodiment of the present invention is described in reference to FIGS. 10(a) and 10(b). FIG. 10(a) is a schematic plan diagram illustrating a case of a two-wound coil, and FIG. 10(b) is a schematic plan diagram illustrating a case of a three-wound coil. First, the case of the two-wound coil in FIG. 10(a) is described. When the length of one wound of the coil is D, the coil between the terminal A and the terminal B has a length of 2 D. When the coil crosses a peripheral wire at the location where the wire length from the terminal A is L ($0<L<D$), there are three points, $x_1$, $x_2$, $x_3$ in which the coil, including the extending coil elements, crosses the peripheral wire. The following six types of noises propagate from the crossing points towards the two terminals A, B.

$N_1$ from $x_1$ towards A with a distance L;
$N_2$ from $x_1$ towards B with a distance 2D−L;
$N_3$ from $x_2$ towards A with a distance D+L;
$N_4$ from $x_2$ towards B with a distance D−L;
$N_5$ from $x_3$ towards A with a distance 2D+L; and
$N_6$ from $x_3$ towards B with a distance L From among these, $N_1$ and $N_6$ offset each other, and thus $N_2$ to $N_5$ are examined below. The following is the order in which these noise signals arrive (here, $0<k<0.5$, $k=L/D$):

$N_4$ with a delay $T_4=10(1-k)^2$ and an inclination $K_4=5-0.8(1-k)^2$;
$N_3$ with a delay $T_3=10(1+k)^2$ and an inclination $K_3=5-0.8(1+k)^2$;
$N_2$ with a delay $T_2=10(2-k)^2$ and an inclination $K_2=5-0.8(2-k)^2$; and
$N_5$ with a delay $T_5=10(2+k)^2$ and an inclination $K_5=5-0.8(2+k)^2$ Accordingly, the peak value Vp6 of the differential noise in the sixth embodiment of the present invention is:

$$V_{p6} = -K_4(T_3 - T_4) + (K_3 - K_4)(T_2 - T_3) + (-K_4 + K_3 - K_2) \times$$
$$(T_5 - T_2) + (-K_4 + K_3 - K_2 + K_5)(100 - T_5)$$
$$= -\{50 - 8(1-k)^2\} \times \{(1+k)^2 - (1-k)^2\} +$$
$$8\{(1-k)^2 - (1+k)^2\} \times \{(2-k)^2 - (1+k)^2\} +$$
$$\{-32k - 50 + 8(2-k)^2\} \times \{(2+k)^2 - (2-k)^2\} +$$
$$\{(-18 - 64k + 8k^2) + (50 - 8(2+k)^2)\} \times \{10 - (2+k)^2\}$$
$$= -888k - 320k^2 + 128k^3$$

In the case of $L=65$ μm, for example, $k=\tfrac{1}{16}$ and the peak value of the differential noise in the sixth embodiment is −57 μV. The simulation showed that the peak value of the differential noise was 40 μV. Likewise, in the case where the coil crosses peripheral wires across the upper side, the left side and the right side, the peak value of the differential noise along the respective sides is 30 μV, 75 μV and 75 μV.

Figure 26:
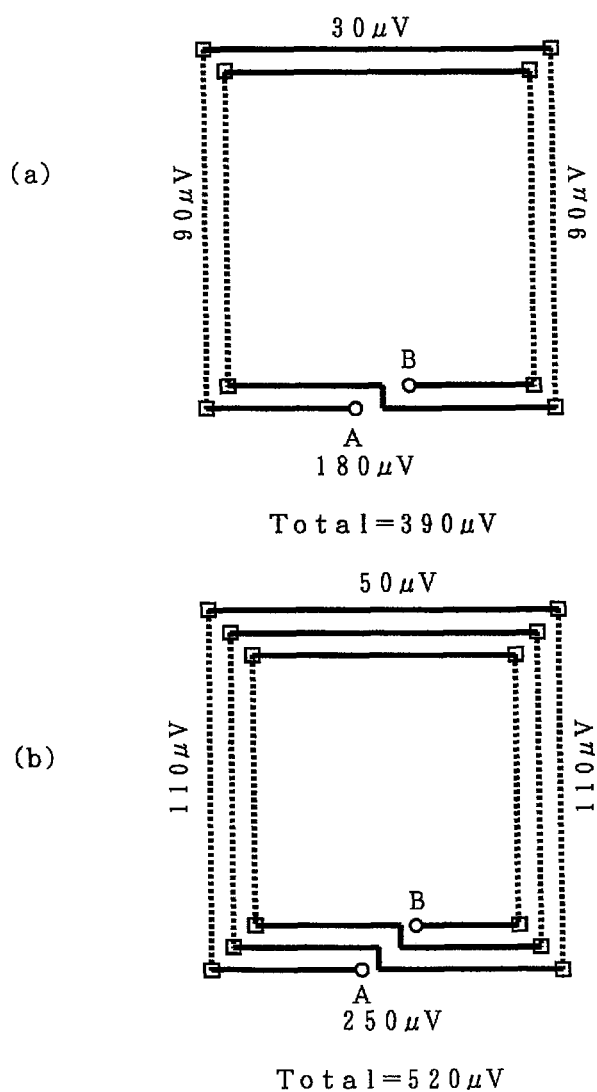
FIGS. 26(a) and 26(b) are diagrams illustrating the peak value of differential noise in a two-wound coil and a three-wound coil.

Meanwhile, the following four types of noises propagate from the two crossing points towards the two terminals A, B in the coil according to the prior art in FIG. 26(a):

$n_1$ from $x_1$ towards A with a distance L;
$n_2$ from $x_1$ towards B with a distance 2D−L;
$n_3$ from $x_2$ towards A with a distance D+L; and
$n_4$ from $x_2$ towards A with a distance D−L The following is the order in which these noise signals arrive (here, $0<k<0.5$, $k=L/D$):

$n_1$ with a delay $T_1=10 \ k^2$ and an inclination $K_1=5-0.8 \ k^2$;
$n_4$ with a delay $T_4=10 \ (1-k)^2$ and an inclination $K_4=5-0.8(1-k)^2$;
$n_3$ with a delay $T_3=10(1+k)^2$ and an inclination $K_3=5-0.8(1+k)^2$; and
$n_2$ with a delay $T_2=10(2-k)^2$ and an inclination $K_2=5-0.8(2-k)^2$ Accordingly, the peak value $V_{p0}$ of the differential noise in the conventional coil is:

$$V_{p0} = K_1(T_4 - T_1) + (K_1 - K_4)(T_3 - T_4) + (K_1 - K_4 + K_3) \times$$
$$(T_2 - T_3) + (K_1 - K_4 + K_3 - K_2)(100 - T_2)$$
$$= \{50 - 8k_2\} \times \{(1 - k)_2 - k_2\} + (8 - 16k_2) \times$$
$$\{(1 + k)_2 - (1 - k)_2\} + (50 - 16k - 24k_2) \times$$
$$\{(2 - k)_2 - (1 + k)_2\} + \{(50 - 16k - 24k_2) -$$
$$(50 - 8(2 - k)_2)\} \times \{10 - (2 - k)_2\}$$
$$= 292 - 544k - 256k_2 + 80k_3 + 16_4$$

In the case of L=65 μm, for example, k=1/16 and the peak value of the differential noise in the coil according to the prior art is 257 μV. The simulation showed that the peak value of the differential noise was 180 μV as shown in FIG. 26(a).

Judging from the two formulas, k<0.2 is achieved in the case where the noise is smaller in the sixth embodiment of the present invention than in the prior art. That is to say, it can be seen that it is good to extend the coil elements by approximately 1/5 of the circumference of the coil. Accordingly, the peak value of the differential noise from the four peripheral wires in the case where the peripheral wires cross the four sides in the same manner is 220 μV, which is approximately 1/1.77 times smaller than 390 μV in the prior art.

Next, in the case of a three-wound coil as in FIG. 10(b), it can be seen from the calculation similar to that in the case of a two-wound coil that it is good to extend the coil elements by approximately 1/6 of the circumference of the coil. In this case, as can be seen from the comparison between FIG. 10(b) and FIG. 26(b), the peak value of the differential noise from the four peripheral wires in the case where the peripheral wires cross the four sides in the same manner is 305 μV, which is 1/1.71 times smaller than 520 μV in the prior art.

Seventh Embodiment

Figure 11:
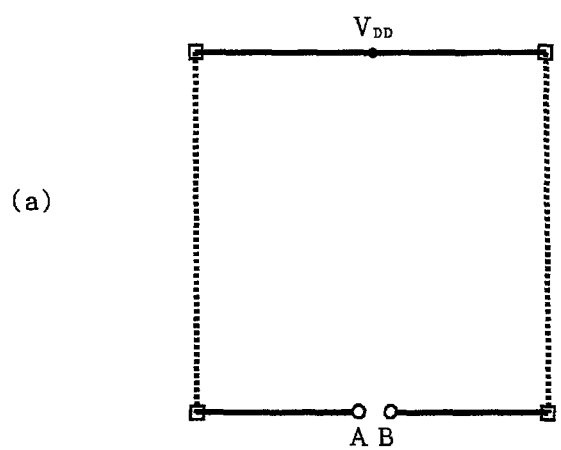
FIGS. 11(a) and 11(b) are diagrams for illustrating the structure of the inductor element according to the seventh embodiment of the present invention.
Figure 11:
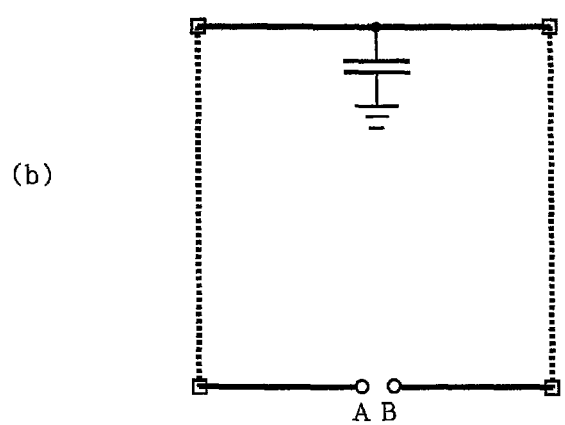

Next, the inductor element according to the seventh embodiment of the present invention is described in reference to FIGS. 11(a) and 11(b). FIG. 11(a) is a schematic plan diagram showing the inductor element according to the seventh embodiment of the present invention where the center of the coil wire, that is to say, the middle point of the second element 301 made of the wire $M_5$, is directly connected to the power. In this case, the power may be $V_{DD}$, GND or other powers. Alternatively, it may be the output of a bias circuit having low output impedance.

FIG. 11(b) shows a modification of the inductor element according to the seventh embodiment of the present invention where the middle point of the second coil element $30_1$ made of the wire $M_5$ is connected to the power through a capacitor C having approximately 1 pF so that the output impedance is low in a high frequency region.

The potential of the center of a coil does not change when a positive or negative inductive power is generated in inductive coupling communication, and therefore the value of the inductance of the coil or the value of the mutual inductance of the coil pair does not change even when the center of the coil is directly connected to the power or connected to the power through a capacitor. Accordingly, the differential amplitude of the signal received through inductive coupling does not change.

Meanwhile, the center of the coil is connected to the power with low impedance, and therefore the amplitude of the noise from a peripheral wire that overlaps a coil element is greatly lower than that in the case of a conventional coil. In the case of FIG. 11(b), for example, the amplitude of the noise waveform is approximately 1/5 times lower than that of a conventional coil.

Here, the noise does not exceed the center point of the coil wire so as to reach the other end, and accordingly the effects of reducing the differential noise as a result of the offsetting of noises are not gained. As a result of simulation, it was found that the differential noise was approximately the same as in a conventional coil. Thus, though the differential noise was not reduced, the in-phase noise was greatly reduced. As a result, the input common mode of the receiver does not change greatly, and therefore there is an advantage such that the gains of the receiver do not change. In addition, such an effect is also gained that the peripheral circuits are less affected by the noise from the transmission coil.

Eighth Embodiment

Figure 12:
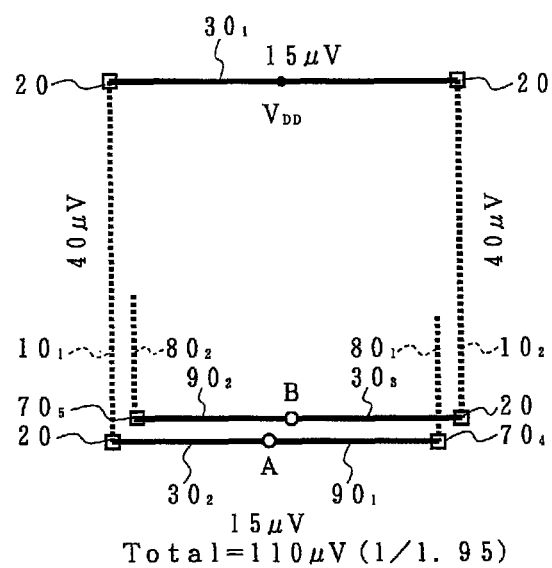
FIG. 12 is a schematic plan diagram showing the inductor element according to the eighth embodiment of the present invention.
Figure 13:
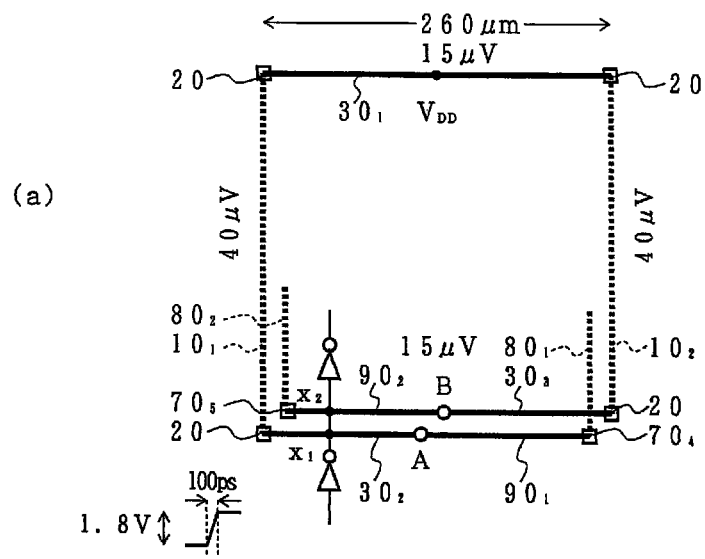
FIGS. 13(a) and 13(b) are diagrams illustrating the results of simulation of the effects of the eighth embodiment of the present invention.
Figure 13:
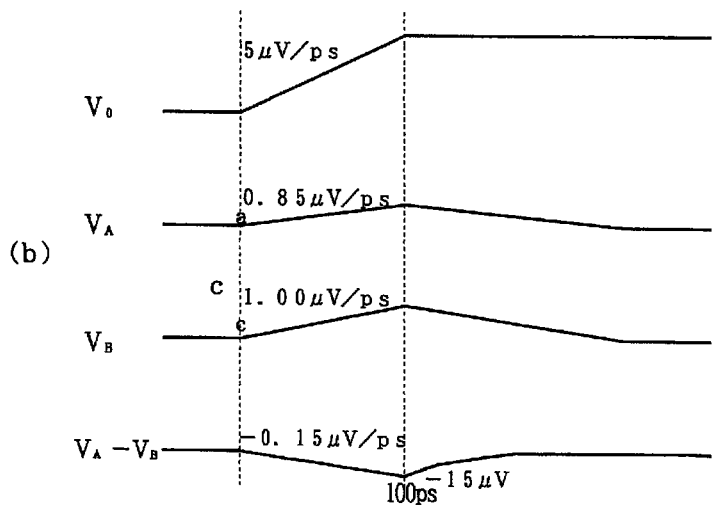

Next, the inductor element according to the eighth embodiment of the present invention is described in reference to FIGS. 12 to 13(b). FIG. 12 is a schematic plan diagram showing the inductor element according to the eighth embodiment of the present invention where the extending coil elements, as in the fifth embodiment, and the connection of the power to the center portion of the coil, as in the seventh embodiment, are combined for use.

FIGS. 13(a) and 13(b) are diagrams for illustrating the results of simulation showing the effects of the eighth embodiment of the present invention. As compared with FIGS. 8(a) and 8(b) concerning the fifth embodiment, the peak voltage of the differential noise generated when the lower side of the coil crosses peripheral wires is 15 μV per peripheral wire, which is smaller than 30 μV in the fifth embodiment. The reason for this is that the noise waveform itself is approximately 1 μV/ps, which is approximately 1/5 times smaller than approximately 5 μV/ps in the fifth embodiment. As a result, the peak value of the differential noise from four peripheral wires in the case where the peripheral wires cross the four sides in the same manner is 110 μV which is approximately 1/1.95 times smaller than 215 μV in the fifth embodiment.

However, the distance between $x_2$ and the center of the coil is slightly greater than the distance between $x_1$ and the center of the coil, and therefore the inclination of the waveform that appears in the terminal B is slightly greater than the inclination of the waveform that appears in the terminal A, and the difference increases during 100 ps and determines the peak voltage of the differential noise.

Ninth Embodiment

Figure 14:
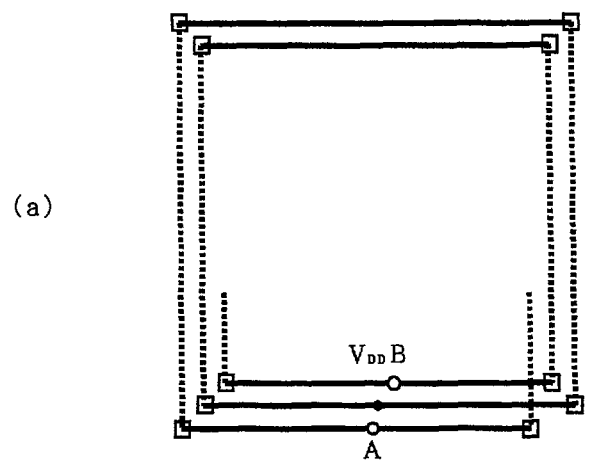
FIGS. 14(a) and 14(b) are diagrams for illustrating the structure of the inductor element according to the ninth embodiment of the present invention.
Figure 14:
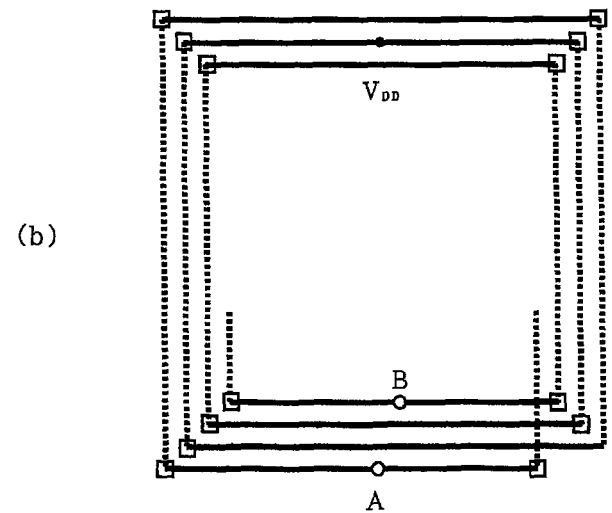

Next, the inductor element according to the ninth embodiment of the present invention is described in reference to FIGS. 14(a) and 14(b). FIGS. 14(a) and 14(b) are diagrams showing the structure of the inductor element according to the ninth embodiment of the present invention where extending coil elements, as in the sixth embodiment, and the connection of the power to the center portion of the coil, as in the seventh embodiment, are combined for use. FIG. 14(a) is a schematic plan diagram showing a two-wound coil, and FIG. 14(b) is a schematic plan diagram showing a three-wound coil. In the case of the ninth embodiment, the same effects as in the eighth embodiment can be gained.

Tenth Embodiment

Figure 15:
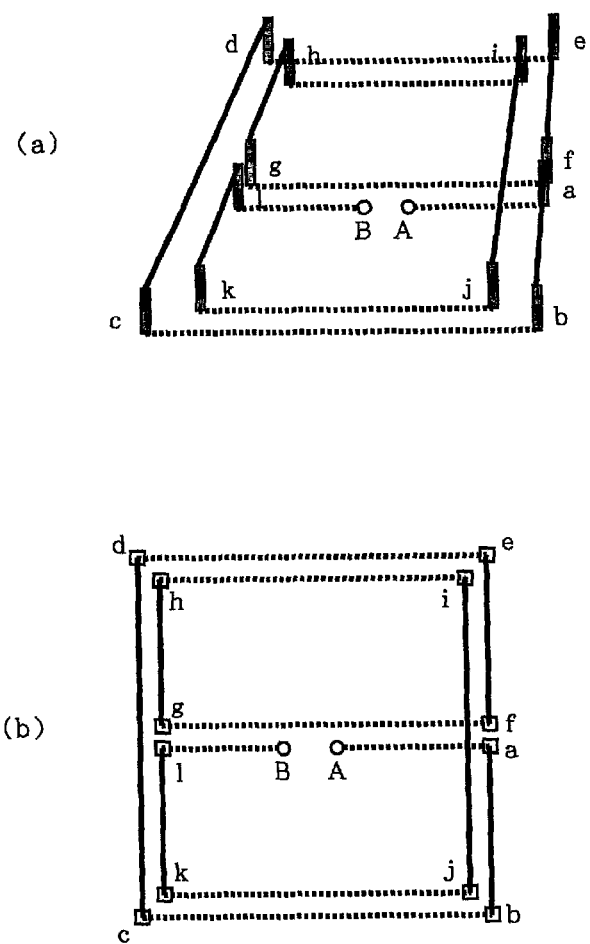
FIGS. 15(a) and 15(b) are diagrams for illustrating the structure of the inductor element according to the tenth embodiment of the present invention.
Figure 16:
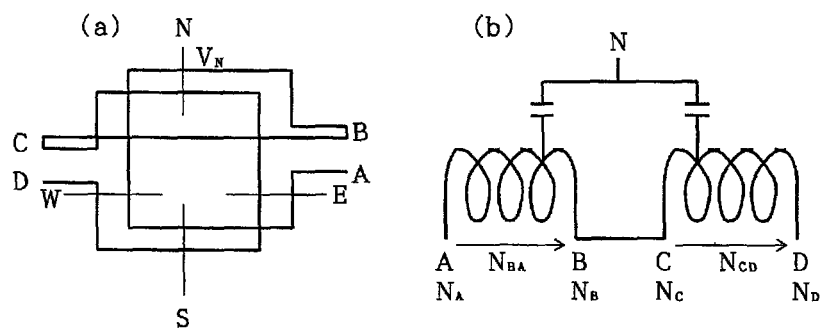
FIGS. 16(a) to 16(c) are diagrams for illustrating the principle of noise offset in the tenth embodiment of the present invention.
Figure 16:
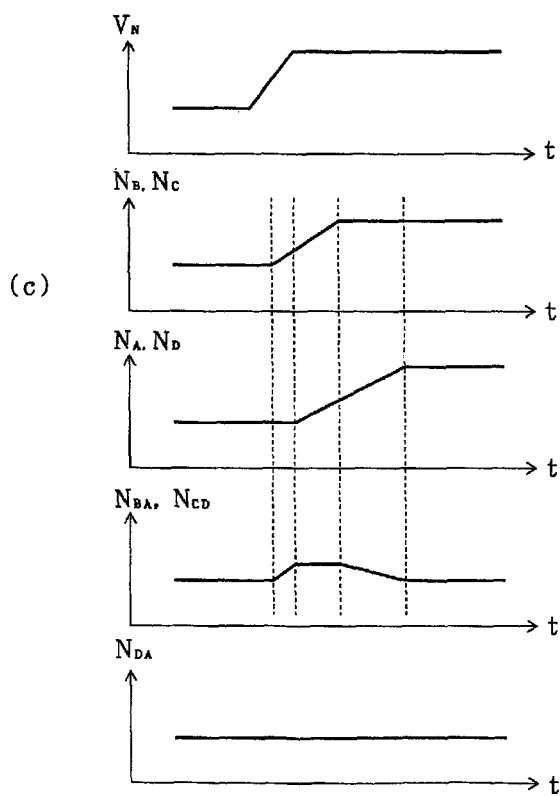
Figure 17:
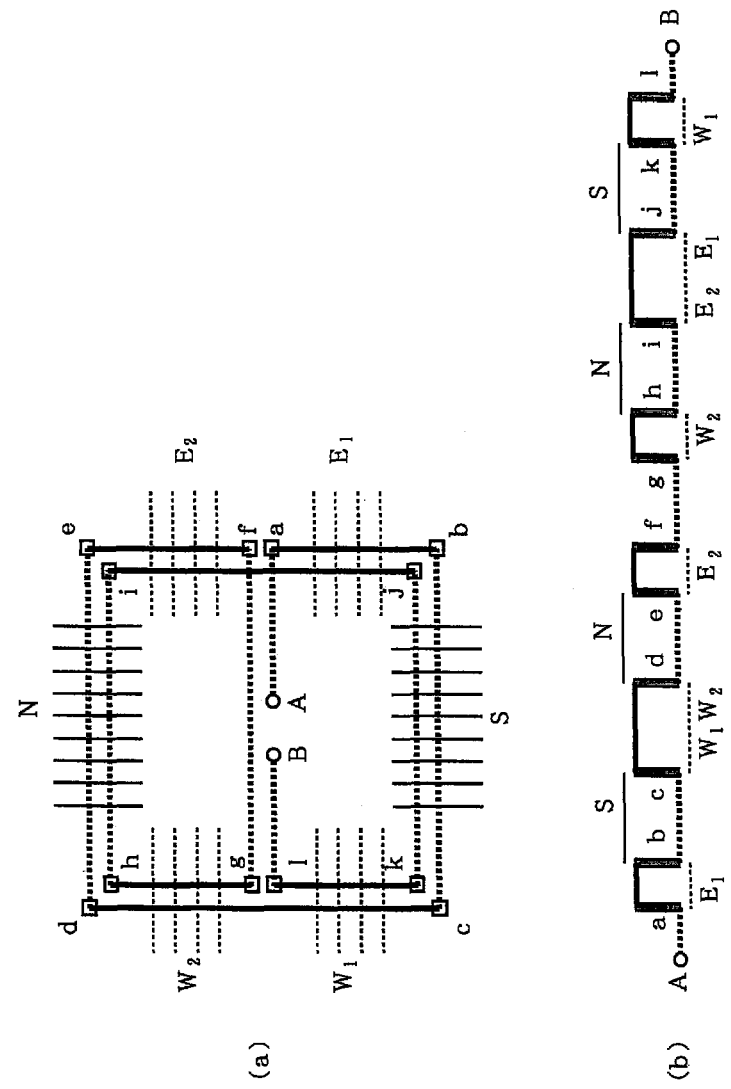
FIGS. 17(a) and 17(b) are diagrams for illustrating the effects of noise removal in the tenth embodiment of the present invention.

Next, the inductor element according to the tenth embodiment of the present invention is described in reference to FIGS. 15(a) to 17(b). FIGS. 15(a) and 15(b) are diagrams showing the structure of the inductor element according to the tenth embodiment of the present invention where FIG. 15(a) is a schematic perspective diagram and FIG. 15(b) is a schematic plan diagram. As shown in these figures, a first coil is wound once clockwise through a→b→c→d→e→f. In addition, a second coil is wound once clockwise in a location overlapping the first coil through g→h→i→j→k→l.

The two coils share the same center and are positioned so as to be rotated by 180° from each other. Furthermore, the terminal f of the first coil is connected to the terminal g of the second coil through a wire that passes through the center of the coils. Here, though the figures show a case where the two terminals A and B of the coils are inside the coils, the two terminals may be drawn out to the outside of the respective coils from the point a and the point l.

Next, the principle of offsetting the noise from peripheral wires in the tenth embodiment of the present invention is described in reference to FIGS. 16(a) to 16(c). FIG. 16(a) is a schematic diagram showing the structure of a coil, FIG. 16(b) is an equivalent circuit diagram, and FIG. 16(c) is a diagram illustrating noise from each peripheral wire. As shown in FIG. 16(a), the first coil and the second coil are both wound clockwise and connected to each other in series, and therefore the inductances, that is to say, transmission/reception signals $S_1$, $S_2$, are added. Meanwhile, the differential components of the noise $N_1$, $N_2$ from the peripheral wires that overlaps the first coil and the second coil are subtracted so that they are partially offset.

The differential components are taken into consideration while the in-phase components are not taken into consideration because the in-phase noise $N_A$ and $N_D$ in the two terminals that overlaps the reception coil is removed by a differential comparator or a differential amplifier to which the two ends of the reception coil are connected, but the differential noise $N_{DA}$ is amplified together with the received signal, and thus deteriorates the quality of the signal (S/N ratio).

As shown in FIG. 16(b), a peripheral wire N crosses the first coil at a location which exceeds the center of the first coil element towards the terminal B, and therefore the noise that overlaps the coil element at this point first reaches the terminal B and then reaches the terminal A with delay. As a result, noise $N_{BA}$ in pulse form as viewed from the terminal A is generated in the terminal B (the polarity depends on the wire signal). Meanwhile, the peripheral wire N crosses the second coil at a location which exceeds the center of the second coil element towards the terminal C, and therefore noise $N_{CD}$ is generated in the terminal C as viewed from the terminal D (the polarity is the same as in the above described polarity).

The distance between the crossing point and the terminal B and the distance between the crossing point and the terminal C are almost equal (they are precisely equal when the peripheral wire N passes through the center of the coil element h-i or d-e), and therefore the time at which the two noises reach the terminal B and the terminal C is almost the same, and thus $N_{BA}=N_{CD}$. Accordingly, the noise $N_{DA}$ in the terminal D as viewed from the terminal A is: $N_{DA}=N_{BA}+N_{DC}=N_{BA}-N_{CD}$, and this approximate level of noise is offset and the differential noise becomes almost zero.

In addition, most of the noise from the peripheral wire S is offset for the same reasons as above. Meanwhile, the crossing points with peripheral wires W and E as in the above description are in different locations from the two ends of the two coils, and therefore there is a difference in the time at which the noise reaches the terminals of the coils, and thus a small amount of differential noise remains.

FIGS. 17(a) and 17(b) are diagrams for concretely illustrating the effects of noise removal in the tenth embodiment of the present invention, where FIG. 17(a) is a schematic plan diagram and FIG. 17(b) is a schematic development diagram. The peripheral wires N made of the wires $M_5$ cross the coil element d-e and the coil element h-i so that the crossing points are located almost symmetrically relative to the center of the coil element, and therefore the time at which the two noises reach the two terminals is almost the same, and the differential noise that appears between the terminals is almost offset.

In an actual case where the crossing point is close to d or h, as shown in FIG. 17(b), for example, the center between the location of capacitive coupling with the wire d-e and the location of capacitive coupling with the wire h-i is slightly closer to the terminal A from the center of the coil, and therefore a noise signal appears on the terminal A side slightly earlier than the terminal B side, and this becomes a differential noise component which allows a slight amount of noise to remain.

As described above, in the tenth embodiment of the present invention, two one-wound coils having similar figures are positioned so that they are rotated by 180° from each other and connected to each other in series through the connection between the second terminal f of the first coil and the first terminal g of the second coil so that the coils rotate in the same direction, and the first terminal a of the first coil and the second terminal i of the second coil are extended so as to provide input/output terminals A, B, and therefore the differential noise that appears between the terminals A, B can be mostly offset.

Here, the noise removal means in the tenth embodiment of the present invention can also be combined with one or two of the noise removal means, such as the above described addition of an extending coil element in the fifth embodiment and the power connection to the middle point of the coil in the eighth embodiment, for use.

Eleventh Embodiment

Figure 18:
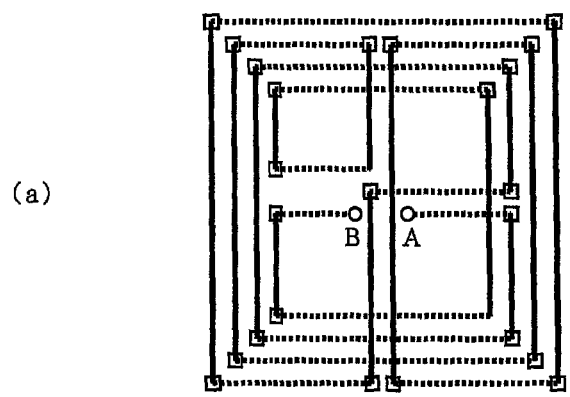
FIGS. 18(a) and 18(b) are diagrams for illustrating the structure of the inductor element according to the eleventh embodiment of the present invention.
Figure 18:
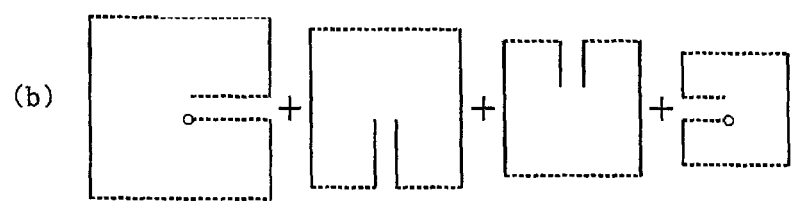

Next, the inductor element according to the eleventh embodiment of the present invention is described in reference to FIGS. 18(a) and 18(b). FIG. 18(a) is a schematic plan diagram showing the inductor element according to the eleventh embodiment of the present invention, and FIG. 18(b) is an exploded diagram thereof. As shown in the figures, in the eleventh embodiment of the present invention, four one-wound coils having similar figures are positioned so as to rotate from each other by 90° and connected one after another in series in the center portion.

Thus, in the eleventh embodiment of the present invention, four one-wound coils having similar figures are positioned so as to rotate from each other by 90° and connected in series so as to form a four-wound coil, and therefore the four sides of the coil can be made equal, and thus the differential noise from peripheral wires W and E can be made lower than in the above described tenth embodiment.

Twelfth Embodiment

Figure 19:
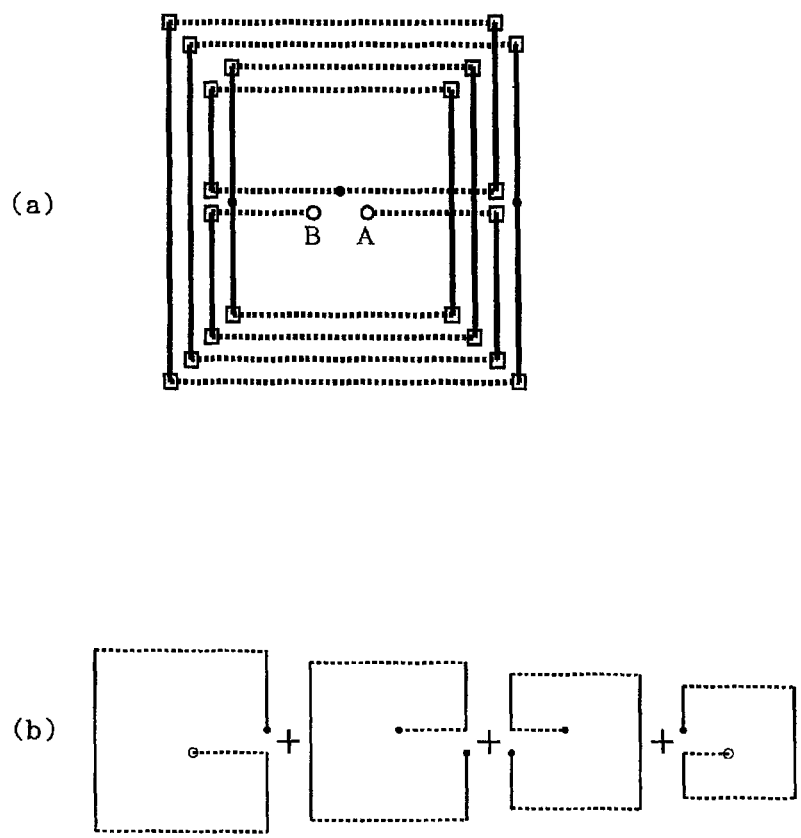
FIGS. 19(a) and 19(b) are diagrams for illustrating the structure of the inductor element according to the twelfth embodiment of the present invention.

Next, the inductor element according to the twelfth embodiment of the present invention is described in reference to FIGS. 19(a) and 19(b). FIG. 19(a) is a schematic plan diagram showing the inductor element according to the twelfth embodiment of the present invention, and FIG. 19(b)

is an exploded diagram thereof. As shown in the figures, in the twelfth embodiment of the present invention, four one-wound coils having similar figures are positioned so as to rotate from each other by 90° and are connected one after another in series in the center portion in the same manner as in the above described eleventh embodiment.

In this case as well, four one-wound coils having similar figures are positioned so as to rotate from each other by 90° and connected in series so as to form a four-wound coil as in the eleventh embodiment of the present invention, and therefore the four sides of the coil can be made equal, and thus the differential noise from the peripheral wires W and E can be made lower than in the above described tenth embodiment.

Thirteenth Embodiment

Figure 20:
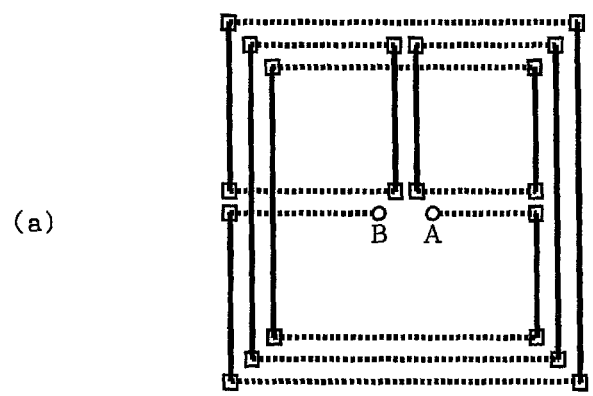
FIGS. 20(a) and 20(b) are diagrams for illustrating the structure of the inductor element according to the thirteenth embodiment of the present invention.
Figure 20:
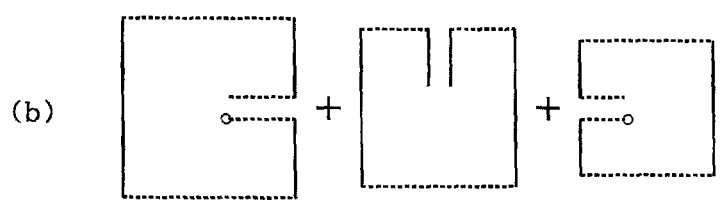

Next, the inductor element according to the thirteenth embodiment of the present invention is described in reference to FIGS. 20(a) and 20(b). FIG. 20(a) is a schematic plan diagram showing the inductor element according to the thirteenth embodiment of the present invention, and FIG. 20(b) is an exploded diagram thereof. As shown in the figures, in the thirteenth embodiment of the present invention, three one-wound coils having similar figures are positioned so as to rotated from each other by 90° and connected one after another in series in the center portion.

In the thirteenth embodiment of the present invention, three one-wound coils having similar figures are positioned so as to be rotated from each other by 90° and connected in series so as to form a three-wound coil, and therefore the four sides of the coil can be made more equal than in the above described tenth embodiment, and thus the differential noise from the peripheral wires W and E can be made lower than in the above described tenth embodiment.

Fourteenth Embodiment

Figure 21:
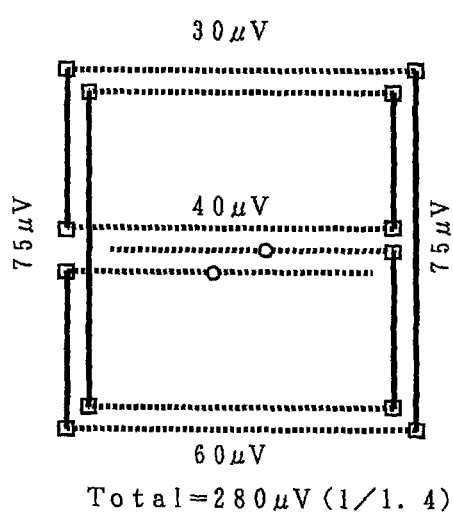
FIG. 21 is a schematic plan diagram showing the inductor element according to the fourteenth embodiment of the present invention.

Next, the inductor element according to the fourteenth embodiment of the present invention is described in reference to FIG. 21. FIG. 21 is a schematic plan diagram showing the inductor element according to the fourteenth embodiment of the present invention where extending coil elements, as in the above described fifth embodiment, are added to an inductor element, as in the above described tenth embodiment.

In the fourteenth embodiment of the present invention, the extending coil elements are added so that the total differential noise can be made 280 µV, which is 1/1.4 times smaller than that of a conventional two-wound coil.

Fifteenth Embodiment

Figure 22:
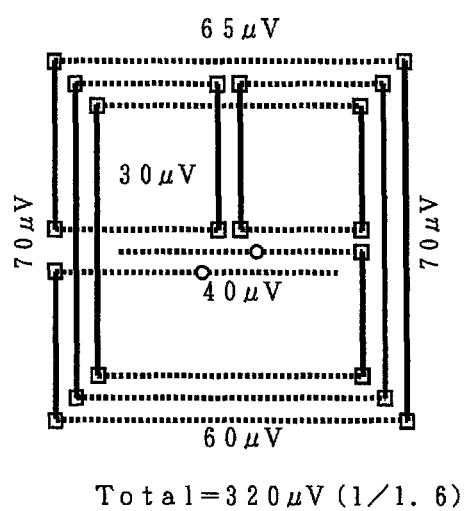
FIG. 22 is a schematic plan diagram showing the inductor element according to the fifteenth embodiment of the present invention.
Figure 23:
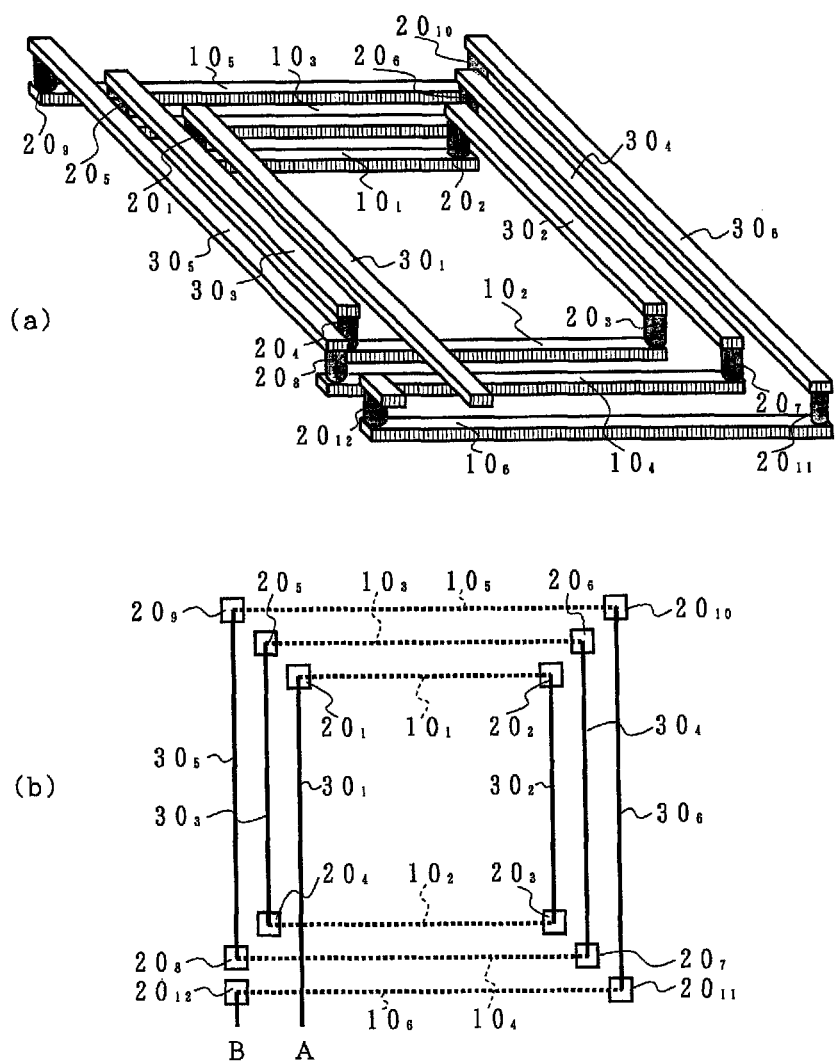
FIGS. 23(a) and 23(b) are diagrams for illustrating the structure of the inductor element proposed by the present inventors.
Figure 24:
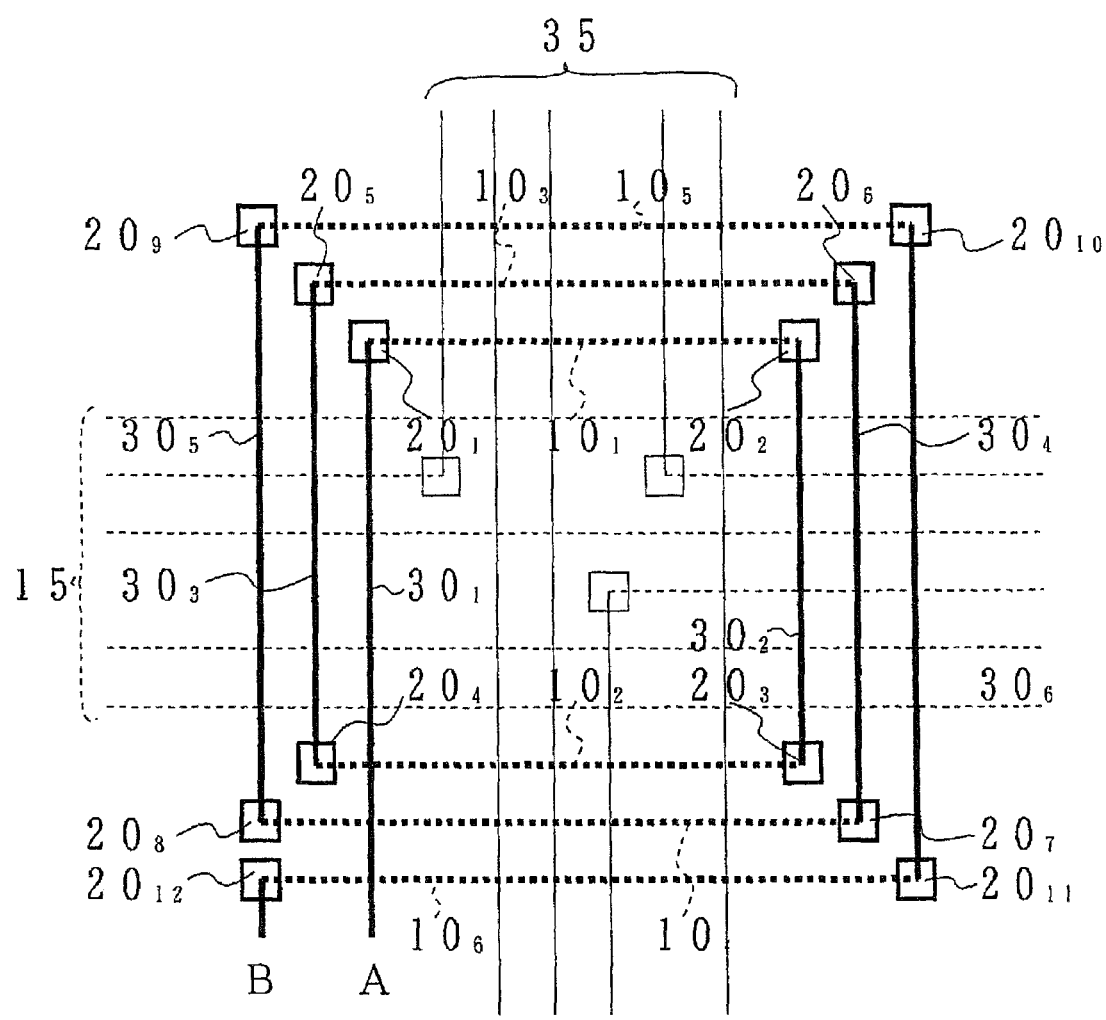
FIG. 24 is a schematic plan diagram showing an inductor element together with peripheral wires.

Next, the inductor element according to the fifteenth embodiment of the present invention is described in reference to FIG. 22. FIG. 22 is a schematic plan diagram showing the inductor element according to the fifteenth embodiment of the present invention where extending coil elements, as in the above described fifth embodiment, are added to an inductor element, as in the above described thirteenth embodiment.

In the fifteenth embodiment of the present invention, extending coil elements are added so that the total differential noise can be made 320 µV, which is 1/1.6 times lower than that of a conventional three-wound coil.

Here, the noise removal means in the eleventh to fifteenth embodiments of the present invention can also be combined with one or two of the noise removal means, such as the power connection to the middle point of a coil in the above described eighth embodiment.

The invention claimed is:

1. An integrated circuit device, comprising:
   a coil comprising
      a plurality of first metal coil elements running in a first direction on a first layer level;
      a plurality of second metal coil elements running, in a second direction different from the first direction, on the second layer level adjacent to the first layer level, wherein the first metal coil elements and the second metal coil elements are connected to form the coil;
   shield wires connected to a power either above or below or to the left or right of the first metal coil elements and the second metal coil elements, and
   a wiring, running on the first layer level between the first metal coil elements, or running on the second layer level between the second metal coil elements.

2. The integrated circuit device according to claim 1, wherein said shield wires do not form a closed loop.

3. An integrated circuit device, comprising:
   a coil comprising
      a plurality of first metal coil elements running in a first direction on a first layer level;
      a plurality of second metal coil elements running, in a second direction different from the first direction, on the second layer level adjacent to the first layer level,
   wherein the first metal coil elements and the second metal coil elements are connected to form the coil; and
   a wiring, running on the first layer level between the first metal coil elements, or running on the second layer level between the second metal coil elements,
   wherein either a region where a wire is prohibited from being layered on the coil elements adjacent to as well as above or below said coil elements or a region where wiring is prohibited in the same plane with said coil elements so that the region can be provided with one to three peripheral wires to the right or left of said coil wires.

4. An integrated circuit device, comprising:
   a coil comprising
      a plurality of first metal coil elements running in a first direction on a first layer level;
      a plurality of second metal coil elements running, in a second direction different from the first direction, on the second layer level adjacent to the first layer level,
   wherein the first metal coil elements and the second metal coil elements are connected to form the coil; and
   a wiring, running on the first layer level between the first metal coil elements, or running on the second layer level between the second metal coil elements,
   wherein extended coil elements which extend from two terminals of said coil.

5. An integrated circuit device, comprising:
   a coil comprising
      a plurality of first metal coil elements running in a first direction on a first layer level;
      a plurality of second metal coil elements running, in a second direction different from the first direction, on the second layer level adjacent to the first layer level,
   wherein the first metal coil elements and the second metal coil elements are connected to form the coil; and
   a wiring, running on the first layer level between the first metal coil elements, or running on the second layer level between the second metal coil elements,
   wherein the potential at the center of said coil is fixed.

6. An integrated circuit device, comprising:
- a plurality of coils comprising
  - a plurality of first metal coil elements running in a first direction on a first layer level;
  - a plurality of second metal coil elements running, in a second direction different from the first direction, on the second layer level adjacent to the first layer level,
- wherein the first metal coil elements and the second metal coil elements are connected to form the coil; and
  - a wiring, running on the first layer level between the first metal coil elements, or running on the second layer level between the second metal coil elements,
  - wherein the coils have similarity shapes having a point of symmetry and are placed around the point of symmetry, and at the same time the coils are arranged in such a manner that each coil in the next layer is rotated in a direction around the point of symmetry and connected in series.

* * * * *